(12) United States Patent
Hayashi et al.

(10) Patent No.: US 8,912,054 B2
(45) Date of Patent: Dec. 16, 2014

(54) THIN-FILM SEMICONDUCTOR DEVICE AND METHOD OF MANUFACTURING THE SAME

(75) Inventors: Hiroshi Hayashi, Osaka (JP); Takahiro Kawashima, Osaka (JP); Genshiro Kawashi, Chiba (JP)

(73) Assignees: Panasonic Corporation, Osaka (JP); Panasonic Liquid Crystal Display Co., Ltd., Hyogo (JP)

( * ) Notice: Subject to any disclaimer, the term of this patent is extended or adjusted under 35 U.S.C. 154(b) by 30 days.

(21) Appl. No.: 13/440,320

(22) Filed: Apr. 5, 2012

(65) Prior Publication Data

US 2013/0105797 A1    May 2, 2013

Related U.S. Application Data

(63) Continuation of application No. PCT/JP2011/006050, filed on Oct. 28, 2011.

(51) Int. Cl.
| | | |
|---|---|---|
| *H01L 21/84* | (2006.01) | |
| *H01L 21/20* | (2006.01) | |
| *H01L 21/31* | (2006.01) | |
| *H01L 29/66* | (2006.01) | |

(52) U.S. Cl.
CPC ................................. *H01L 29/66765* (2013.01)
USPC ............ 438/151; 438/166; 438/487; 438/789

(58) Field of Classification Search
USPC ........... 438/151, 166, 487, 789; 257/E21.414
See application file for complete search history.

(56) References Cited

U.S. PATENT DOCUMENTS

| | | | | |
|---|---|---|---|---|
| 5,639,699 | A * | 6/1997 | Nakamura et al. | 427/527 |
| 5,738,960 | A * | 4/1998 | Abe | 430/21 |
| 5,738,973 | A * | 4/1998 | Abe | 430/270.11 |
| 5,907,393 | A * | 5/1999 | Kawano et al. | 356/73 |
| 7,768,009 | B2 | 8/2010 | Kobayashi et al. | |
| 7,940,345 | B2 | 5/2011 | Yamazaki | |
| 7,955,916 | B2 | 6/2011 | Hayashi et al. | |
| 7,960,295 | B2 * | 6/2011 | Park | 438/780 |
| 8,133,771 | B2 | 3/2012 | Kobayashi et al. | |
| 2006/0199316 | A1 * | 9/2006 | Kuo | 438/151 |
| 2008/0093462 | A1 * | 4/2008 | Abe et al. | 235/492 |
| 2008/0283842 | A1 | 11/2008 | Hayashi et al. | |
| 2009/0021664 | A1 | 1/2009 | Yamazaki | |
| 2009/0046757 | A1 * | 2/2009 | Miyairi et al. | 372/101 |
| 2009/0057672 | A1 | 3/2009 | Kobayashi et al. | |
| 2010/0207253 | A1 * | 8/2010 | Moriwaka | 257/628 |

(Continued)

FOREIGN PATENT DOCUMENTS

| | | |
|---|---|---|
| JP | 9-283443 | 10/1997 |
| JP | 10-189991 | 7/1998 |
| JP | 2005-300913 | 10/2005 |
| JP | 2008-288424 | 11/2008 |

(Continued)

*Primary Examiner* — Charles Garber
*Assistant Examiner* — Ron Pompey
(74) *Attorney, Agent, or Firm* — Greenblum & Bernstein P.L.C.

(57) ABSTRACT

A method of manufacturing a thin-film semiconductor device according to the present disclosure includes: preparing a substrate; forming a gate electrode above the substrate; forming a first insulating film on the gate electrode; forming a semiconductor thin film that is to be a channel layer, on the first insulating film; forming a second insulating film on the semiconductor thin film; irradiating the second insulating film with a beam so as to increase a transmittance of the second insulating film; and forming a source electrode and a drain electrode above the channel layer.

12 Claims, 22 Drawing Sheets

(56) References Cited

U.S. PATENT DOCUMENTS

| | | |
|---|---|---|
| 2010/0285624 A1 | 11/2010 | Kobayashi et al. |
| 2011/0034659 A1 | 2/2011 | Kashio et al. |
| 2011/0198595 A1 | 8/2011 | Yamazaki |
| 2011/0198600 A1 | 8/2011 | Hayashi et al. |

FOREIGN PATENT DOCUMENTS

| | | |
|---|---|---|
| JP | 2009-49385 | 3/2009 |
| JP | 2009-76894 | 4/2009 |
| JP | 2011-192771 | 9/2011 |
| WO | 2009/101753 | 8/2009 |

* cited by examiner

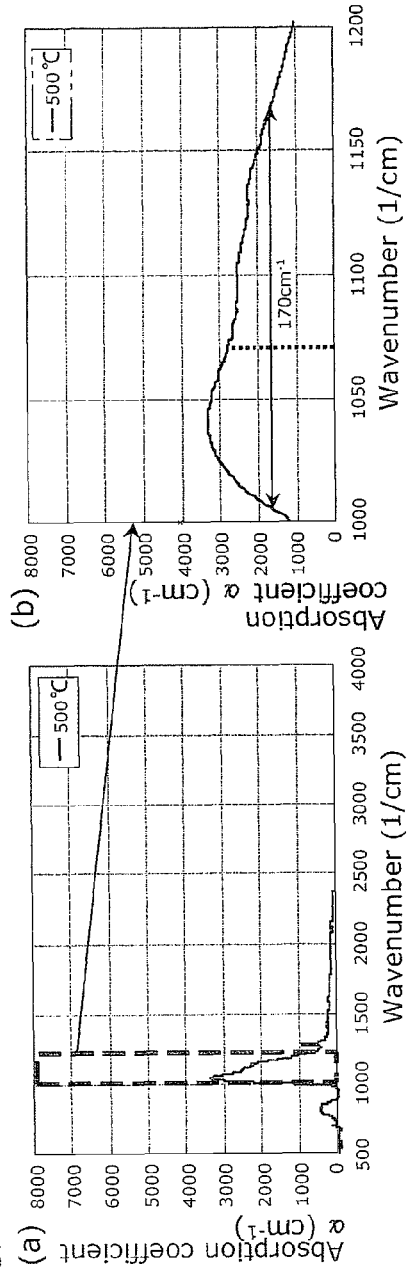
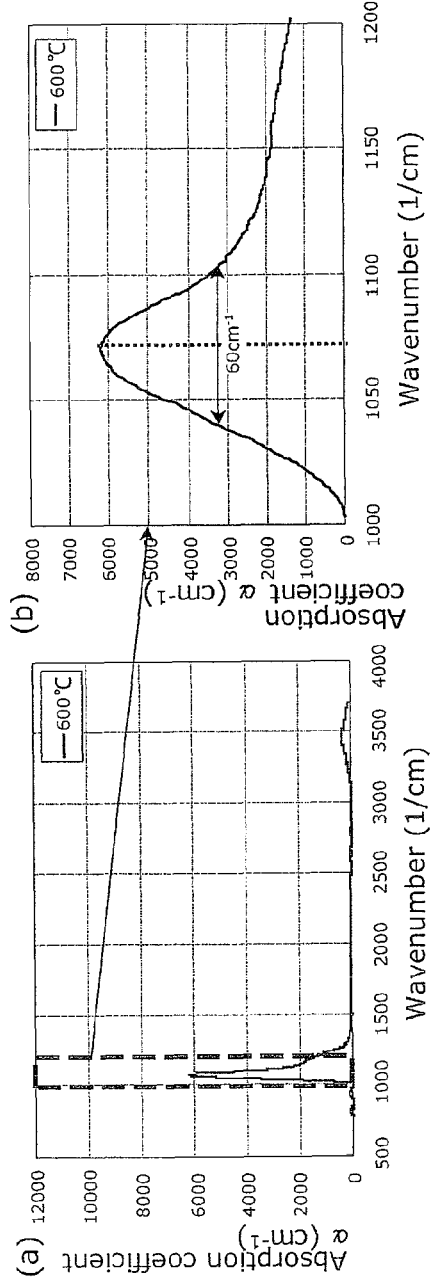
FIG. 8A
FIG. 8B (Y: amino group, epoxy group, methacryl group, vinyl group, mercapto group)

THIN-FILM SEMICONDUCTOR DEVICE AND METHOD OF MANUFACTURING THE SAME

CROSS REFERENCE TO RELATED APPLICATION

This is a continuation application of PCT Patent Application No. PCT/JP2011/006050 filed on Oct. 28, 2011, designating the United States of America. The entire disclosure of the above-identified application, including the specifications, drawings and claims is incorporated herein by reference in its entirety.

TECHNICAL FIELD

The present disclosure relates to a thin-film semiconductor device and a method of manufacturing the thin-film semiconductor device, and relates particularly to a thin-film transistor of a channel protection type and a method of manufacturing the thin-film transistor.

BACKGROUND ART

Recently, an organic electroluminescence (EL) display using electroluminescence (EL) of an organic material has been attracting attention as one of next-generation flat panel displays to replace the liquid crystal display. In an active-matrix display apparatus such as an organic EL display, a thin-film semiconductor device referred to as a thin film transistor (TFT) is used.

Particularly, the organic EL display, unlike the liquid crystal display that is voltage-driven, is a current-driven device, so that it is urgently expected to develop a thin-film transistor having an advantage in ON-OFF characteristics as a driving circuit used for the active-matrix display apparatus. In the configuration of the thin-film transistor, a gate electrode, a semiconductor layer (channel layer), a source electrode, and a drain electrode are formed above the substrate, and it is common to use a silicon thin film for the channel layer.

In addition, for the display device, a larger screen and lower costs are expected, and as a thin-film transistor that can readily achieve lower costs, a bottom-gate thin-film transistor in which the gate electrode is formed closer to the substrate than to the channel layer is generally used.

The bottom-gate thin-film transistor is largely divided into two types: a channel-etching thin-film transistor whose channel layer is etched, and a thin-film transistor of a channel protection type (etching stopper type) which protects the channel layer from the etching processing.

The channel-etching thin-film transistor has an advantage of allowing reduction in the number of photolithography processes compared to the thin-film transistor of the channel protection type, thus suppressing production costs.

On the other hand, the thin-film transistor of the channel protection type can prevent damage to the channel layer caused by etching processing, thus suppressing unevenness in characteristics within a substrate surface. In addition, the thin-film transistor of the channel protection type has an advantage because the channel protection type allows further thinning the channel layer to reduce a parasitic resistance component, thus increasing ON characteristics.

For this reason, the thin-film transistor of the channel protection type is appropriate for, for example, a driving transistor in the organic EL display apparatus using a current-driven organic EL device, and it is attempted to adopt such a channel-protection thin-film transistor for the driving circuit of the organic EL display apparatus even if the manufacturing cost increases compared to the channel-etching TFT.

For example, Patent Literature 1 discloses a channel-protection TFT including a microcrystalline semiconductor thin film as a channel layer, and describes forming a channel protection film above a channel layer via a buffer layer.

CITATION LIST

Patent Literature

Japanese Unexamined Patent Publication Application No. 2009-76894

SUMMARY OF INVENTION

Technical Problem

However, in the channel-protection TFT, a positive fixed charge, which exists in the channel protection layer, generates a back channel in the channel layer, which causes a leakage current to increase and deteriorate OFF characteristics of the TFT. Particularly, since the channel protection layer that is formed by applying an organic material thereto includes a larger amount of positive fixed charge than the channel protection layer formed using an inorganic material, the leakage current further increases to deteriorate OFF characteristics.

In addition, in the channel-protection TFT, a carrier is likely to be trapped by a trap level which exists within the channel protection layer due to impurity included in the channel protection layer, and this, as a result, causes a shift in threshold voltage for the TFT, deteriorating reliability of the TFT. Particularly, in the channel protection layer formed of a coat-type organic material, since more trap levels are included in the channel protection layer than in the channel protection layer formed of an inorganic material, an amount of shift in the threshold voltage becomes larger, further deteriorating the reliability of the TFT.

The present disclosure is conceived in view of the problem described above, and it is an object of the present disclosure to provide, in a thin-film transistor of a channel protection type, a thin-film semiconductor device having an advantage in OFF characteristics and reliability and a manufacturing method thereof.

Solution to Problem

To achieve the above object, a method of manufacturing a thin-film semiconductor device according to an aspect of the present disclosure includes: preparing a substrate; forming a gate electrode above the substrate; forming a first insulating film on the gate electrode; forming a semiconductor thin film that is to be a channel layer, on the first insulating film; forming a second insulating film on the semiconductor thin film; irradiating the second insulating film with a beam so as to increase a transmittance of the second insulating film; and forming a source electrode and a drain electrode above the channel layer.

In addition, a thin-film semiconductor device according to an aspect of the present disclosure includes: a substrate; a gate electrode formed above the substrate; a first insulating film formed on the gate electrode; a crystalline semiconductor thin film formed on the first insulating film; a source electrode and a drain electrode that are formed above the crystalline semiconductor thin film; and a second insulating film formed on the crystalline semiconductor thin film, and the second insulating film is formed by irradiating a precursor of the second insulating film with the beam, and a transmittance of the second insulating film for the beam is higher after irradiation of the beam than before the irradiation.

Advantageous Effects of Invention

According to the present disclosure, it is possible to realize a thin-film semiconductor device.

BRIEF DESCRIPTION OF DRAWINGS

These and other objects, advantages and features of the disclosure will become apparent from the following description thereof taken in conjunction with the accompanying drawings that illustrate a specific embodiment of the present disclosure. In the Drawings:

FIG. 8A is an enlarged view of an IR spectrum of an organic film in (c) in FIG. 7;

FIG. 8B is an enlarged view of an IR spectrum of an organic film in (d) in FIG. 7;

DESCRIPTION OF EMBODIMENTS

Figure 1:
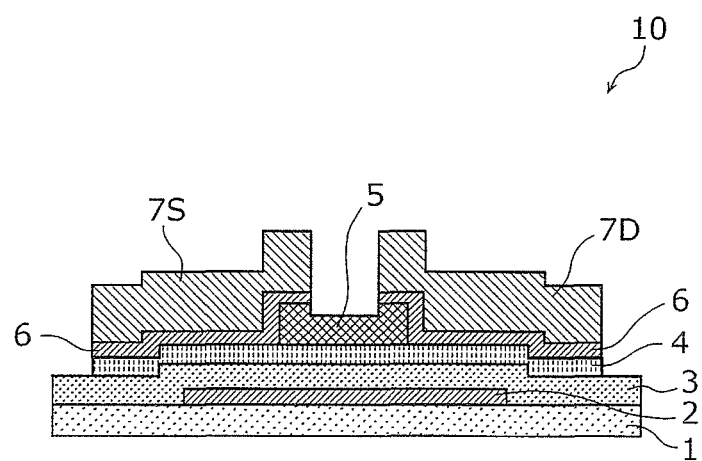
FIG. 1 is a cross-sectional view showing a configuration of a thin-film semiconductor device according to a first embodiment of the present disclosure.

A method of manufacturing a thin-film semiconductor device according to an aspect of the present disclosure includes: preparing a substrate; forming a gate electrode above the substrate; forming a first insulating film on the gate electrode; forming a semiconductor thin film that is to be a channel layer, on the first insulating film; forming a second insulating film on the semiconductor thin film; irradiating the second insulating film with a beam so as to increase a transmittance of the second insulating film; and forming a source electrode and a drain electrode above the channel layer.

According to this aspect, the transmittance of the second insulating film is increased by irradiating, with a beam, the second insulating film formed on the semiconductor thin film. This mineralizes the second insulating film, and accordingly reduces the fixed charge in the second insulating film to suppress generation of the back channel, thus realizing a thin-film semiconductor apparatus having an advantage in OFF characteristics. Furthermore, by mineralizing the second insulating film, trap levels in the second insulating film can be reduced to suppress the trapping of the carrier and thereby suppress a shift in threshold voltage, thus realizing a reliable thin-film semiconductor device.

In addition, in the method of manufacturing a thin-film semiconductor device according to an aspect of the present disclosure, in the forming of a second insulating film, it is preferable that the second insulating film be formed using an organic material having a transmittance of below 37 percent for the beam, and that in the irradiating, the transmittance of the second insulating film be increased to 37 percent or more through irradiation of the beam.

According to the aspect of the present disclosure, since the transmittance of the second insulating film before the irradiation of the beam is 37% or less, the beam is absorbed into the second insulating film, to generate heat. This readily allows transparentizing the second insulating film. In addition, since the transmittance of the second insulating film after the irradiation of the beam is 37% or more, the beam is transmitted through the second insulating film and absorbed into the semiconductor thin film, to generate heat. This readily allows performing heat treatment on the semiconductor thin layer, so as to transparentize the second insulating film through thermal propagation. With these advantageous effects, it is possible to realize a thin-film semiconductor device having an advantage in OFF characteristics and reliability.

In addition, in the method of manufacturing a thin-film semiconductor device according to an aspect of the present disclosure, in the forming of a semiconductor thin film, it is preferable that the semiconductor thin film that is noncrystalline be formed, and that in the irradiating, the second insulating film be irradiated with the beam from above so as to crystallize the semiconductor thin film under the second insulating film.

According to the present aspect, one beam scan allows increasing the transmittance of the second insulating film as well as crystallizing the semiconductor film. As a result, without increasing the number of processes, it is possible to increase the transmittance of the second insulating film.

In addition, in the method of manufacturing a thin-film semiconductor device according to an aspect of the present disclosure, in the forming of a semiconductor thin film, the semiconductor thin film that is noncrystalline may be formed, and the method further may include crystallizing the semiconductor thin film between the irradiating and the forming of a source electrode and a drain electrode. Alternatively, in the forming of a semiconductor thin film, the semiconductor thin film that is crystallized may be formed.

According to the present aspect, since the process of increasing the transmittance of the second insulating film and the process of crystallizing the semiconductor film are performed separately, it is possible to perform beam irradiation under a desired condition for each process. Accordingly, it is possible to reliably increase the transmittance of the second insulating film as well as reliably crystallizing the semiconductor thin film.

In addition, in the method of manufacturing a thin-film semiconductor device according to an aspect of the present disclosure, before irradiation of the beam, a product of an absorption coefficient of the second insulating film and a film thickness of the second insulating film can be greater than 1.

In addition, after irradiation of the beam, a product of an absorption coefficient of the second insulating film and a film thickness of the second insulating film can be 1 or less.

In addition, in the method of manufacturing a thin-film semiconductor device according to an aspect of the present disclosure, in the irradiating, the second insulating film can be mineralized by irradiation of the beam. In this case, the second insulating film can be mineralized when the beam causes photoreaction or thermal reaction to progress in the second insulating film.

In addition, a thin-film semiconductor device according to an aspect of the present disclosure includes: a substrate; a gate electrode formed above the substrate; a first insulating film formed on the gate electrode; a crystalline semiconductor thin film formed on the first insulating film; a source electrode and a drain electrode that are formed above the crystalline semiconductor thin film; and a second insulating film formed on the crystalline semiconductor thin film, and the second insulating film is formed by irradiating a precursor of the second insulating film with the beam, and a transmittance of the second insulating film for the beam is higher after irradiation of the beam than before the irradiation.

According to the present aspect, by irradiating, with the beam, the second insulating film on the semiconductor thin film, it is possible to increase the transmittance of the second insulating film. Since this mineralizes the second insulating film, it is possible to reduce the fixed charge in the second insulating film to suppress generation of the back channel, thus realizing a thin-film semiconductor apparatus having an advantage in OFF characteristics. Furthermore, mineralizing the second insulating film can reduce the trap levels in the second insulating film so as to suppress trapping of carriers and thereby suppress a shift in threshold voltage, thus realizing a reliable thin-film semiconductor device.

In addition, in a thin-film semiconductor device according to an aspect of the present disclosure, the transmittance of the second insulating film for the beam can be below 37 percent before irradiation of the beam and can be 37 percent or more after the irradiation.

In addition, in a thin-film semiconductor device according to an aspect of the present disclosure, the precursor can be formed of an organic material, and the second insulating film can be mineralized when the organic material is irradiated with the beam.

In addition, in a thin-film semiconductor device according to an aspect of the present disclosure, before irradiation of the beam, a product of an absorption coefficient of the second insulating film and a film thickness of the second insulating film can be greater than 1.

In addition, in a thin-film semiconductor device according to an aspect of the present disclosure, after irradiation of the beam, a product of an absorption coefficient of the second insulating film and a film thickness of the second insulating film can be 1 or less.

In addition, in a thin-film semiconductor device according to an aspect of the present disclosure, it is preferable that the thin-film semiconductor device further include an interface layer formed between the crystalline semiconductor thin film and the second insulating film and containing carbon, and that a concentration of the carbon contained in the interface layer be 50 times or more higher than a concentration of carbon contained as impurity in the crystalline semiconductor thin film. In this case, it is preferable that the concentration of the carbon contained in the interface layer be $5\times10^{20}$ atoms/cm$^3$ or more.

In addition, in a thin-film semiconductor device according to an aspect of the present disclosure, the interface layer can contain sulfur. In this case, it is preferable that a concentration of the sulfur contained in the interface layer be 100 times or more higher than a concentration of sulfur contained as impurity in the crystalline semiconductor thin film. Alternatively, it is preferable that the concentration of the sulfur contained in the interface layer be $5 \times 10^{19}$ atoms/cm$^3$ or more.

In addition, in a thin-film semiconductor device according to an aspect of the present disclosure, it is preferable that a resistivity of the interface layer be $2 \times 10^6$ Ω·cm or more.

In addition, in a thin-film semiconductor device according to an aspect of the present disclosure, the interface layer can have a thickness ranging from 1 nm to 5 nm.

Hereinafter, a thin-film semiconductor device and a manufacturing method thereof according to embodiments of the present disclosure will be described with reference to the drawings. Note that any one of the embodiments described below illustrates a preferred specific example of the present disclosure. A value, a shape, a material, a constituent element, a location of the constituent element, and a connection mode, steps, and an order of the steps are mere examples and are not intended to limit the present disclosure. In other words, the present disclosure is specified only by the claims. Therefore, some constituent elements in the embodiments below, which are not described in the claims representing the highest concepts of the present disclosure, are described as constituting a preferred embodiment although such constituent elements are not essential for solving the problem of the present disclosure. In addition, in each figure, the element substantially representing the same configuration, operation, and advantageous effect will be assigned with the same numerical reference Embodiment 1

First, a configuration of a thin-film semiconductor device 10 according to a first embodiment of the present disclosure will be described with reference to FIG. 1. FIG. 1 is a cross-sectional view schematically showing the configuration of the thin-film semiconductor device 10 according to the first embodiment of the present disclosure.

As shown in FIG. 1, the thin-film semiconductor device 10 according to the first embodiment of the present disclosure is a bottom-gate thin-film transistor of a channel protection type, and includes: a substrate 1; a gate electrode 2; a gate insulating film (first insulating film) 3; a channel layer (semiconductor thin film) 4; and a channel protection film (second insulating film) 5 that are serially formed above the substrate. The thin-film semiconductor device 10 further includes a pair of contact layers 6 formed above the channel layer 4 with the channel protection film 5 interposed therebetween; and a pair of a source electrode 7S and a drain electrode 7D that are formed on the contact layer 6.

Hereinafter, each constituent element in the thin-film transistor 10 according to the present embodiment will be described in detail.

The substrate 1 is a glass substrate made of a glass material, for example, silica glass, alkali-free glass, high heat resistance glass, and so on. Note that a substrate including an undercoat layer that includes, in the surface, silicon nitride (Si$N_x$), silicon oxide (SiO$_y$), silicon oxide nitride (SiO$_y$N$_x$), or the like may be used, so as to prevent impurities such as sodium, phosphorus, and the like included in the glass substrate from invading the channel layer 4. In addition, in some cases, the undercoat layer plays a role to mitigate the influence of heat on the substrate 1 in a high temperature heat process such as laser annealing. The film thickness of the undercoat layer may be, for example, approximately 100 nm to 2000 nm.

The gate electrode 2 is formed into a predetermined shape above the substrate 1. The gate electrode 2 has a monolayer structure or a multilayer structure including a conductive material resistant to a melting-point temperature of silicon, an alloy thereof, and the like and can be formed using, for example: molybdenum (Mo), aluminum (Al), copper (Cu), tungsten (W), tantalum (Ta), niobium (Nb), nickel (Ni), titanium (Ti), chrome (Cr), molybdenum-tungsten (MoW), and the like. The gate electrode 2 is formed by forming, on the substrate 1, a gate metal film made of such material and patterning the gate metal film into a predetermined shape. Preferably, the gate electrode 2 should have a film thickness ranging from 30 nm to 300 nm, and more preferably should have a film thickness ranging from 50 nm to 100 nm. This is because the gate electrode 2 having a small film thickness causes the transmittance of the gate electrode 2 to increase, so that laser beam reflection is more likely to be reduced. On the other hand, the gate electrode 2 having a large film thickness has a decreased coverage over the gate insulating film 3, and in particular, is more likely to deteriorate characteristics of the thin-film transistor such as a cut in steps in the gate insulating film at end portions of the gate electrode 2, and so on.

The gate insulating film 3, which is a first insulating film formed on the gate electrode 2, is formed above the substrate 1 and the gate electrode 2 to cover the gate electrode 2 on the substrate 1. The gate insulating film 3 can be formed using, for example, silicon oxide, silicon nitride, silicon oxide nitride, aluminum oxide (AlO$_z$), tantalum oxide (TaO$_w$), or a stacked film thereof and the like.

Note that in the present embodiment, since a crystalline silicon thin film is used as the cannel layer 4, it is preferable to use silicon oxide as the gate insulating film 3. This is because it is preferable to provide a satisfactory interface state between the channel layer 4 and the gate insulating film 3 in order to maintain satisfactory threshold voltage characteristics in the TFT, and silicon oxide is appropriate for this purpose.

The channel layer 4 has a channel region that is a region which includes a crystalline semiconductor thin film formed on the gate insulating film 3 and in which carrier transfer is controlled by the voltage of the gate electrode 2. According to the present embodiment, at least the channel region in the channel layer 4 is a crystalline silicon thin film formed of polycrystalline silicon thin film, and is a crystallized region formed by irradiating, with a laser, at least part of amorphous silicon in a noncrystalline silicon thin film (amorphous silicon film) as a precursor, so as to polycrystallize (including microcrystallization) the irradiated amorphous silicon. Note that the channel layer 4 can also be a crystalline silicon thin film having a mixed crystal structure of noncrystalline silicon and crystalline silicon. In addition, an average grain size of a crystal included in the channel layer 4 ranges, for example, from 10 nm to 1 µm.

According to the present embodiment, the crystallization of the channel layer 4 is performed at the same time as a process of modifying the film quality of the channel protection film 5, and scanning is performed, using a laser beam, from above an organic film 5a that is a precursor of the channel protection film 5, to perform laser irradiation on a region in which the organic film 5a is not formed and a region in which the organic film 5a is formed, both of which regions are included in the noncrystalline silicon thin film. With this, the noncrystalline silicon thin film including a region under the organic film 5a is crystallized into a crystalline silicon thin film.

The channel protection film 5 is a second insulating film formed on the channel layer 4, and protects the channel region of the channel layer 4. In other words, the channel protection film 5 functions as a channel etching stopper (CES) layer for preventing the channel layer 4 from being etched in the etching processing for forming the pair of contact layers 6. Note that the channel protection film 5 has insulation properties, so that the pair of contact layers 6 are not electrically connected to each other.

In addition, the channel protection film 5 is formed by irradiating, with a laser beam, the organic film applied onto the channel layer 4. The channel protection film 5 is a film transparentized by laser irradiation performed on an opaque organic film that is a precursor (the channel protection film 5 before laser irradiation), and the transmittance of the channel protection film 5 for the laser beam is higher after laser irradiation than the transmittance before laser irradiation. In other words, the transmittance of the channel protection film 5 after laser irradiation is higher than the transmittance of the channel protection film 5 before laser irradiation.

In addition, in the channel protection film 5, the transmittance of the organic film (precursor) for the laser beam is below 37%. In other words, the transmittance of the channel protection film 5 for the laser beam before laser irradiation is below 37%. At this time, before laser irradiation, a product of the absorption coefficient of the channel protection film 5 and the film thickness of the channel protection film 5 is greater than 1.

On the other hand, this organic film (precursor) is transparentized as a result of laser irradiation, and has a transmittance for the laser beam of 37% or more. In other words, the transmittance of the channel protection film 5 for the laser beam after laser irradiation is 37% or more. At this time, after laser irradiation, a product of the absorption coefficient of the channel protection film 5 and the film thickness of the channel protection film 5 is 1 or less.

Note that the transmittance of the channel protection film 5 is determined by the film thickness of the organic film and the absorption coefficient of the organic film. In addition, the absorption coefficient of the organic film is determined by the wavelength of the laser beam and the heating temperature of the organic film. The details will be described laser.

Furthermore, the quality of the organic film (precursor) is modified by laser irradiation into a mineralized film that is mainly composed of an inorganic component such as a silicon oxide component and a silicon nitride component. In other words, the channel protection film 5 is a film transparentized by performing laser irradiation on an organic film that is a precursor, and is also a film mineralized by the laser irradiation.

Here, the organic film that is the precursor of the channel protection film 5 is formed of an organic material that mainly contains an organic material including oxygen and carbon, and can be formed by, for example, patterning and solidifying a photosensitive coat-type organic material.

The organic material for forming this organic film (precursor) includes, for example, an organic resin material, a surfactant, a solvent, and a photosensitizer. For the organic resin material, it is possible to use a photosensitive or non-photosensitive organic resin material that is composed of one or more from among: polyimide, acryl, polyamide, polyimideamide, resist, benzocyclobutene, and so on. For the surfactant, a surfactant including a silicon compound such as siloxane can be used. For the solvent, an organic solvent such as propyleneglycol monomethylether acetate, 1,4-dioxane, and the like can be used. In addition, for the photosensitizer, a positive-type photosensitizer such as naphthoquinone diazide can be used. Note that the photosensitizer includes carbon and sulfur.

The pair of contact layers 6 are formed of an amorphous semiconductor layer containing a high concentration of impurity or a polycrystalline semiconductor layer including a high concentration of impurity, and a part of the contact layers 6 is provided above the channel layer 4 via the channel protection film 5 and the other part is formed on and in contact with the channel layer 4. In addition, the pair of contact layers 6 are placed opposite to each other at a predetermined interval on the channel protection film 5.

Each of the pair of contact layers is formed across an area from a top end portion of the channel protection film 5 to a top surface of the channel layer 4 such that the top and side surfaces of the channel protection film 5 and the top surface of the channel layer 4 are covered. More specifically, the two contact layers 6 are provided above both end portions of the channel layer, and are provided above the top and side surfaces at the end portions of the channel protection film 5, and on side surfaces included in the channel layer 4 and continuing into the side surfaces of the channel protection film 5.

Each of the pair of contact layers 6 is, for example, an n-type semiconductor layer in which amorphous silicon is doped with phosphorous (P) as impurity, and is an n$^+$-layer including a high impurity concentration at $1 \times 10^{19}$ (atm/cm$^3$) or higher. Note that the film thickness of the contact layer 6 can be, for example, 5 nm to 100 nm.

Each of a pair of the source electrode 7S and the drain electrode 7D are formed above the channel region (crystallized region) in the channel layer 4 via the channel protection film 5, and according to the present embodiment, the source and drain electrodes 7S and 7D are placed opposite to each other at a predetermined interval on the pair of contact layers 6. In other words, the source electrode 7S is formed above one end portion of the channel layer 4 via the contact layer, and the drain electrode 7D is formed above the other end portion of the channel layer via the contact layer 6.

Each of the source and drain electrodes 7S and 7D can be formed into a single layer structure or a multilayer structure formed of a conductive material or an alloy of such materials and so on, and is formed of a material such as aluminum (Al), tantalum (Ta), molybdenum (Mo), tungsten (W), silver (Ag), copper (Cu), titanium (Ti), or chrome (Cr). In addition, the source and drain electrodes 7S and 7D may have a trilayer structure of MoW/Al/MoW. Note that the film thickness of the source and drain electrodes 7S and 7D can be, for example, approximately 100 nm to 500 nm.

Figure 2:
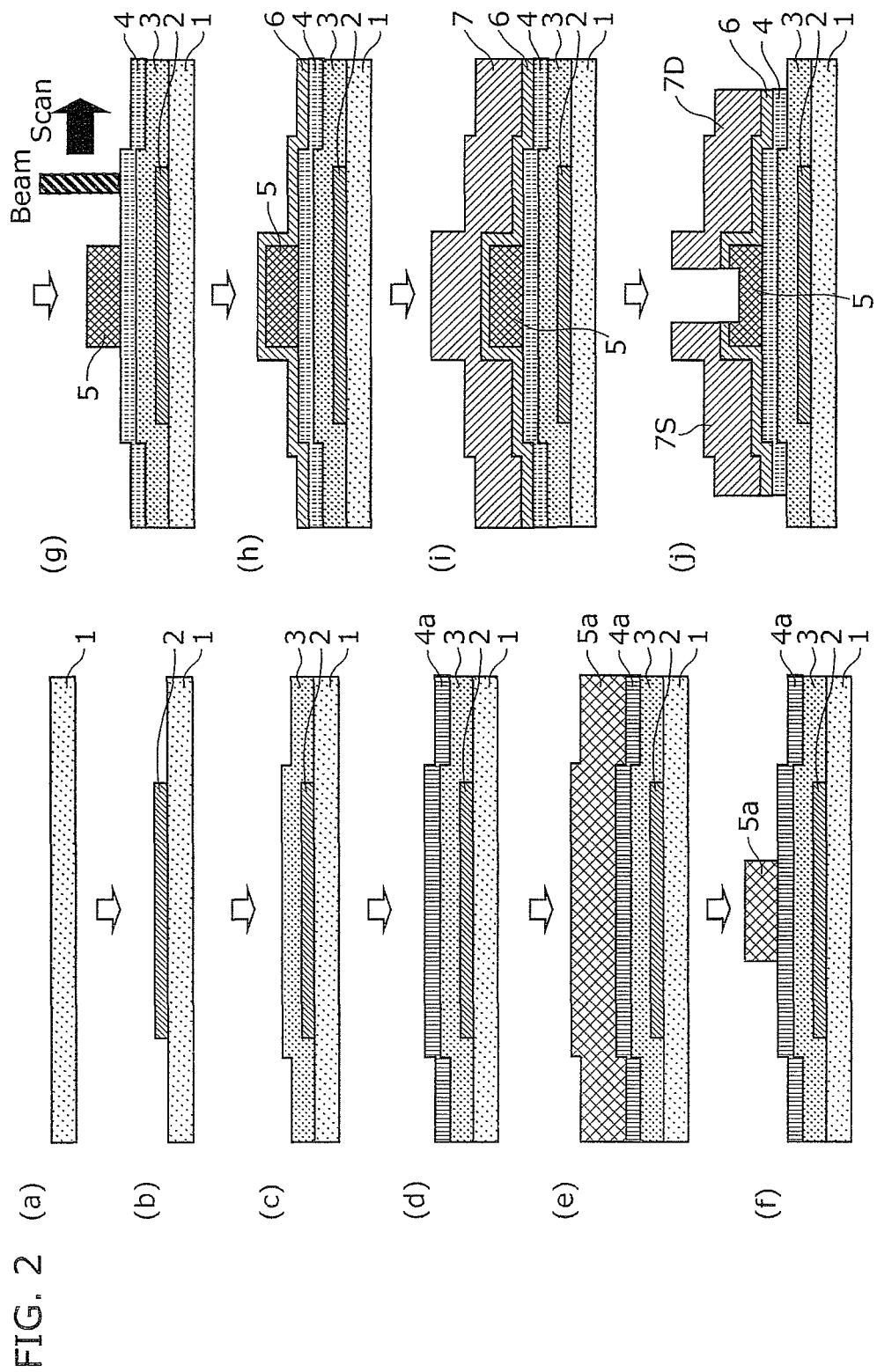
FIG. 2 is a cross-sectional view for describing a method of manufacturing a thin-film semiconductor device according to the first embodiment of the present disclosure.

Next, the method of manufacturing the thin-film semiconductor device 10 according to the first embodiment of the present disclosure will be described with reference to FIG. 2. FIG. 2 is a cross-sectional view schematically showing the configuration in each process in the method of manufacturing the thin-film semiconductor device according to the first embodiment of the present disclosure.

A method of manufacturing a thin-film semiconductor device according to the present embodiment includes: preparing a substrate; forming a gate electrode above the substrate; forming a first insulating film on the gate electrode; forming a semiconductor thin film that is to be a channel layer, on the first insulating film; forming a second insulating film on the semiconductor thin film; irradiating the second insulating film with a beam so as to increase a transmittance of the second insulating film; and forming a source electrode and a drain electrode above the channel layer.

Hereinafter, each process in the method of manufacturing the thin-film semiconductor device according to the present embodiment will be described in detail with reference to the drawings.

First, as shown in (a) in FIG. 2, a glass substrate is prepared as the substrate 1. Note that before forming the gate electrode 2, an undercoat layer including a silicon nitride film, a silicon oxide film, or a silicon oxide nitride film may be formed on the substrate 1 by plasma chemical vapor decomposition (CVD) and the like. It is preferable that the undercoat layer may be formed of silicon oxide film ($SiO_y$) of $1.5<y<2.0$ with a film thickness ranging from 300 nm to 1500 nm. A more preferable film thickness of the undercoat layer ranges from 500 nm to 1000 nm. This is because increasing the thickness of the undercoat layer reduces heat load on the substrate but causes flaking or cracking in the film when the film is too thick. Note that the process of preparing the substrate 1 includes a process of cleansing the substrate 1 other than the process of forming the undercoat layer.

Next, as shown in (b) in FIG. 2, the gate electrode 2 having a predetermined shape is formed on the substrate 1. For example, the gate electrode 2 having a predetermined shape can be formed by: forming a gate metal film as the gate electrode film 2 above the substrate 1 by spattering, using a refractory metal including Mo or MoW or an alloy of the refractory metal, and patterning the gate metal film using the photolithography and wet etching. MoW can be wet-etched using, for example, a chemical in which phosphoric acid ($HPO_4$), nitric acid ($HNO_3$), acetic acid ($CH_3COOH$) and water are mixed at a predetermined composition. Note that when the undercoat layer is formed on the surface of the substrate 1, the gate electrode 2 is formed on the undercoat layer.

Next, as shown in (c) in FIG. 2, the gate insulating film 3 is formed above the substrate 1 and on the gate electrode 2 to cover the gate electrode 2. For example, by the plasma CVD method, a silicon oxide film or a silicon nitride film, or a stacked film of these is formed as the gate insulating film 3, on the gate electrode 2.

Next, as shown in (d) in FIG. 2, a noncrystalline semiconductor thin film 4a that is to be the channel layer 4 is formed on the gate insulating film 3. For example, as a noncrystalline semiconductor thin film 4a, a noncrystalline silicon thin film is formed on the gate insulating film 3 by plasma CVD and the like, using amorphous silicon. This noncrystalline silicon thin film can be formed by, for example, introducing silane gas ($SiH_4$) and hydrogen gas ($H_2$) at a predetermined concentration ratio. Note that the noncrystalline silicon thin film can be formed continuously with the forming of the gate insulating film 3 by plasma CVD.

Next, as shown in (e) in FIG. 2, an organic film 5a is formed, using an organic material, on the noncrystalline semiconductor thin film 4a by a predetermined application method, as a precursor of the channel protection film 5. For example, by applying and spin coating a predetermined organic material over the noncrystalline semiconductor thin film 4a, the organic film 5a is formed across an entire surface of the noncrystalline semiconductor thin film 4a. Note that as the predetermined organic material for the organic film 5a, the photosensitive coat-type organic material including silicon, oxygen, and carbon can be used. In addition, it is preferable that the organic film 5a be formed to have a transmittance of below 37% for the laser beam that is to be used for irradiation in the subsequent process. Note that subsequently, prebaking is performed on the organic film 5a. For example, the organic film 5a is heated for approximately 60 seconds at a temperature of approximately 110° C. This causes the solvent in the organic film 5a to vaporize.

Next, as shown in (f) in FIG. 2, the organic film 5a is patterned into a predetermined shape by exposure and development using a photomask. Note that as a developing fluid, for example, a tetra methyl ammonium hydroxide (TMAH) solution of 2.38% can be used. Subsequently, post-baking is performed on the organic film 5a formed by patterning. For example, the organic film 5a is heated for approximately one hour at a temperature of approximately 280° C. to 300° C. This causes part of the organic component in the organic film 5a to vaporize to be decomposed, thus improving the film quality.

Next, as shown in (g) in FIG. 2, the semiconductor thin film 4a and the organic film 5a thus exposed are irradiated with a laser beam by relatively scanning the substrate 1 with a predetermined laser beam in a constant direction from above the organic film 5a.

At this time, the transmittance of the organic film 5a irradiated with the laser beam is increased, so that the organic film 5a is transparentized. In this case, for the laser beam, it is preferable to perform the laser irradiation under the condition such that the transmittance of the organic film 5a after the laser irradiation is 37% or more. The organic film 5a is transparentized when the laser beam is absorbed into the organic film 5a to cause photoreaction or thermal reaction.

Furthermore, in the present embodiment, the laser beam is transmitted through the organic film 5a as a result of the organic film 5a being transparentized. With this, the region of the noncrystalline semiconductor film 4a in which the organic film 5a is formed is irradiated with the laser beam. Accordingly, the laser irradiation is performed not only on the region in which the organic film 5a is not formed but also on the region in which the organic film 5a is formed, thus allowing crystallizing the entire noncrystalline semiconductor thin film 4a irradiated with the laser beam. In other words, the noncrystalline semiconductor thin film 4a located under the organic film 5a is also crystallized. With this processing, it is possible to crystallize the noncrystalline semiconductor thin film 4a into the channel layer 4 including a polycrystalline crystallized region (including microcrystals). Thus, by performing laser irradiation from above the organic film 5a, the noncrystalline semiconductor thin film 4a is crystallized to form a crystallized region.

The crystallization of the noncrystalline semiconductor thin film 4a is manifested when the noncrystalline semiconductor thin film 4a absorbs the energy of the laser beam to increase the temperature. In the present embodiment, the amorphous silicon film is used as the noncrystalline semiconductor film 4a, and therefore the present embodiment is applicable not only to the case where the temperature of the amorphous silicon rises up to 1414 degrees (the melting point of silicon) or higher to poly-crystallize the amorphous silicon but also to the case where the amorphous silicon becomes microcrystallized after being through a solid phase growth or a super cooled liquid state at a temperature of approximately 750 degrees to 1414 degrees. In this case, the average grain size of the crystallized silicon in the channel layer 4 is approximately 5 nm to 1000 nm, and in some cases, the channel layer 4 includes not only polycrystalline silicon having an average grain size of 100 nm or more but also microcrystalline silicon called microcrystal (μc) having an average grain size of 5 nm to 100 nm.

Thus, in the present embodiment, by relatively scanning the substrate with a laser beam, the processes of transparentizing the organic film 5a and crystallizing the noncrystalline semiconductor film 4a are performed at the same time.

Furthermore, in the present embodiment, the organic film 5a is mineralized when irradiated with the laser beam. The organic film 5a is mineralized due to thermal reaction of the organic film 5a itself when the laser beam is absorbed into the organic film 5a, and when heat of formation of the noncrystalline semiconductor thin film 4a is generated when the noncrystalline semiconductor thin film 4a becomes crystallized. At this time, it is preferable that the temperature of the organic film 5a be 600 degrees or higher. Note that mineralizing the organic film 5a will be described later in detail.

The laser beam in this processing, as will be described later, is determined in consideration of mineralizing the organic film 5a and crystallizing the noncrystalline semiconductor thin film 4a. For example, as a laser source of the laser beam, a light source that emits light having a wavelength of an ultraviolet region, a visible light region, or an infrared region can be used, and such light sources can be selectively used according to the process of transparentizing the organic film and the process of crystallizing the semiconductor thin film as shown in (g) in FIG. 2. According to the present embodiment, it is possible to use a laser that emits light having a wavelength of the ultraviolet region. For example, it is possible to use an excimer laser whose emission wavelength at which the absorption coefficient of the organic film rapidly changes from the opaque region to the transparent region ranges from 190 nm to 350 nm.

Note that the noncrystalline semiconductor thin film 4a and the organic film 5a are irradiated with a laser beam that is linearly collected, and for example, there are two methods for performing such irradiation. One is a method of fixing the irradiation position of the linearly-collected laser beam and moving a stage on which the substrate 1 in which the noncrystalline semiconductor film 4a and the organic film 5a are formed is placed. The other method is, conversely, to fix the stage (substrate 1) and moving the irradiation position of the laser beam. In either method, the noncrystalline semiconductor thin film 4a and the organic film 5a are irradiated with the laser beam that is moving relative to the films.

Next, as shown in (h) in FIG. 2, the contact layer 6 is formed to cover an area from the top surface of the channel protection film 5 across the top surface of the channel layer 4. Specifically, the contact layer 6 is formed by, for example, plasma CVD and the like, using amorphous silicon doped with pentad impurity such as phosphorous, so as to cover the top and side surfaces of the channel protection film 5 and the top surface of the channel layer 4.

Next, as shown in (i) in FIG. 2, a source-drain metal film 7 that is to be the source electrode 7S and the drain electrode 7D is formed to cover the contact layer 6. For example, the source-drain metal film 7 having a trilayer structure of MoW/Al/MoW is formed by sputtering.

Subsequently, although not shown, in order to form the source electrode 7S and the drain electrode 7D having a predetermined shape, a resist material is applied on the source-drain metal film 7, and exposure and development is performed so as to form a resist that is patterned in a predetermined shape.

Next, by patterning the source-drain metal film 7 through wet etching using this resist as a mask, the source electrode 7S and the drain electrode 7D having a predetermined shape are formed as shown in (j) in FIG. 2. At this time, the contact layer 6 functions as an etching stopper. Subsequently, by removing the resist from the source electrode 7S and the drain electrode 7D and performing dry etching using the source electrode 7S and the drain electrode 7D as a mask, the contact layer 6 is patterned along with patterning the channel layer into an island state. This allows forming a pair of contact layers 6 having a predetermined shape and the channel layer 4 in an island state. As the condition for the dry etching, for example, it is possible to use chlorine gas.

Thus, it is possible to manufacture the thin-film semiconductor device 10 according to the present embodiment of the present disclosure.

Next, the characteristics of the thin-film semiconductor apparatus according to the present embodiment, including the context which has led to the present disclosure, will be described with reference to FIGS. 3A to 14.

Figure 3A:
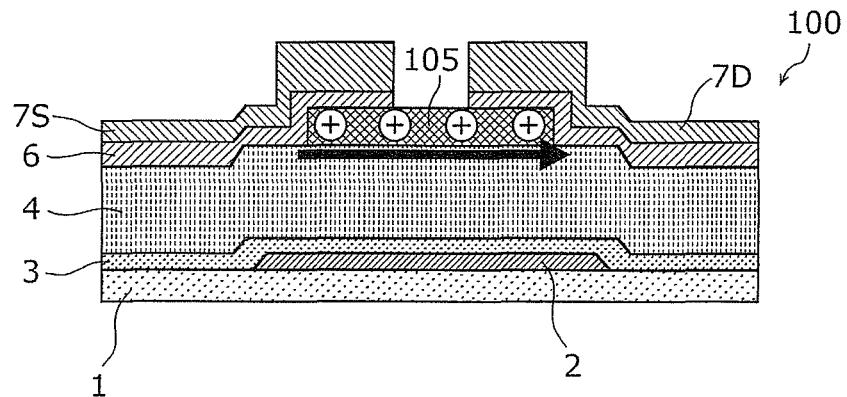
FIG. 3A is a cross-sectional view showing a configuration of a conventional thin-film semiconductor device.
Figure 3B:
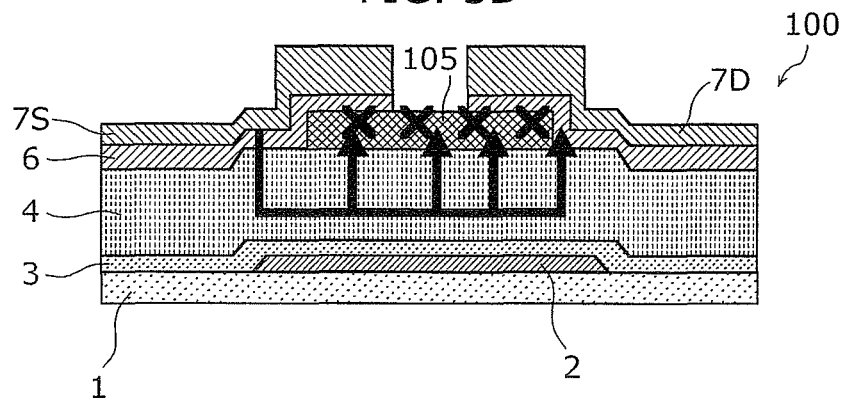
FIG. 3B is a cross-sectional view showing a configuration of a conventional thin-film semiconductor device.
Figure 4:
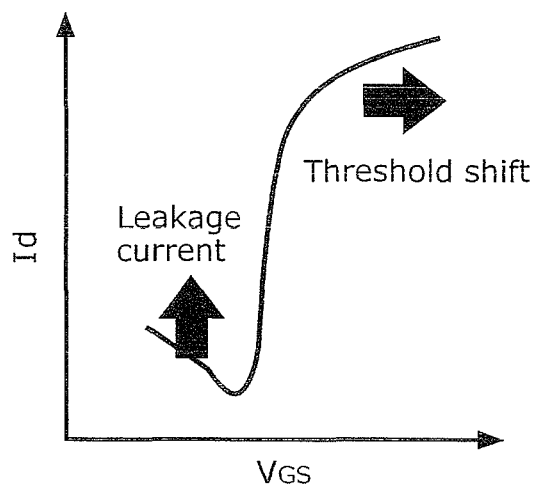
FIG. 4 is a diagram showing current and voltage characteristics of a conventional thin-film semiconductor device.

First, a problem of a conventional thin-film semiconductor device 100 will be described with reference to FIGS. 3A and 3B, and FIG. 4. Each of FIGS. 3A and 3B is a cross-sectional view showing a configuration of the conventional thin-film semiconductor device. In addition, FIG. 4 is a diagram showing current and voltage characteristics of the conventional thin-film semiconductor device.

The conventional thin-film semiconductor device 100 shown in FIGS. 3A and 3B and the thin-film semiconductor device 10 according to the present embodiment as shown in FIG. 1 are different in the configuration of the channel protection film in that: the channel protection film 105 in the conventional thin-film semiconductor device 100 is formed of an organic material but is not irradiated with the laser beam, and therefore the channel protection film 105 in the conventional thin-film semiconductor device 100 is neither transparentized nor mineralized.

In the conventional thin-film semiconductor device 100 thus configured, as shown in FIG. 3A, the channel protection film 105 formed of an organic material includes a large amount of positive fixed charge. Accordingly, the fixed charge causes a fine voltage (Vf) to be applied to the channel layer 4 (near an interface between the channel protection film 5 and the channel layer 4) under the channel protection film 105. In this case, when the voltage (Vf) due to the fixed charge becomes higher than or equal to a threshold voltage (Vbc) of the back channel in the channel layer 4, a parasitic transistor operates to form the back channel. This causes an increase in the leakage current, and as shown in FIG. 4, deteriorates the OFF characteristics of the thin-film semiconductor device.

In addition, a large number of trap levels exist in the channel protection film 105 due to impurities and so on included in the channel protection film 105 formed of an organic material, and such trap levels are likely to trap carriers. As shown in FIG. 4, since carriers are trapped by these trap levels, the threshold voltage of the thin-film semiconductor device 100 is caused to shift, which deteriorates reliability of the thin-film semiconductor device or causes variation in electrical characteristics, thus deteriorating in-plane uniformity of the substrate.

Thus, the thin-film semiconductor device having a channel protection film made of an organic material has a problem of having poor OFF characteristics and reliability.

Thus, the inventors of the present disclosure, as a result of concentrated consideration based on the experiments below, have found out a solution for the problem described above by mineralizing the channel protection film formed of an organic film, that is, by approximating a stoichiometry of the organic film to a stoichiometry of the inorganic film. This will be described in detail below.

Figure 5:
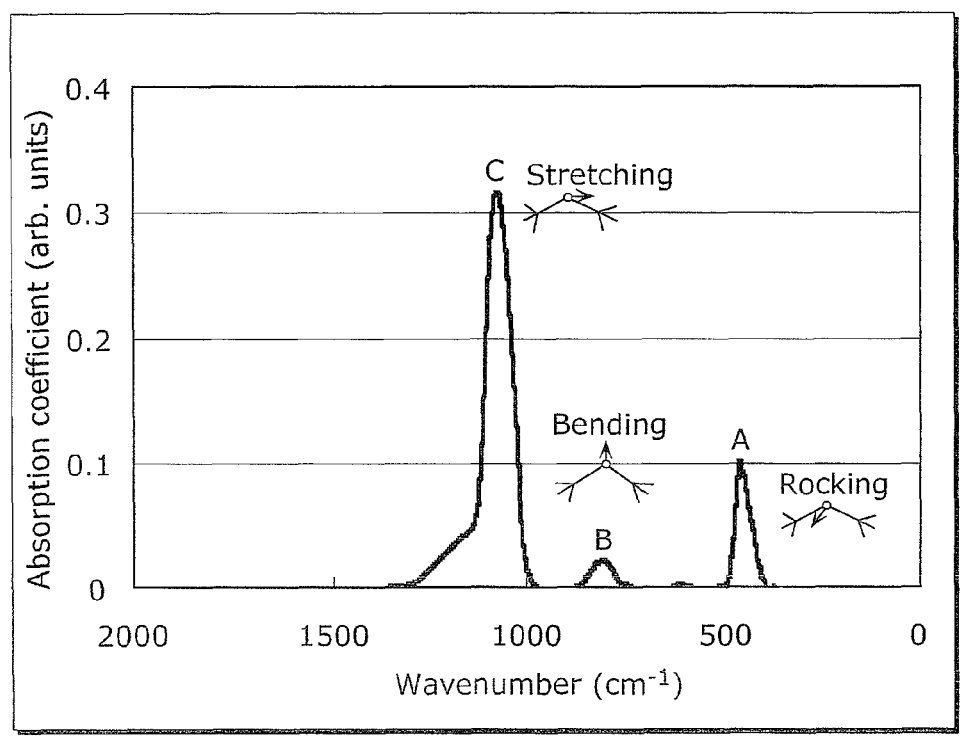
FIG. 5 is a diagram showing an IR spectrum of a silicon oxide film.

First, as an inorganic film made of an inorganic material, there is a silicon oxide film. Accordingly, first, to search a chemical structure of the silicon oxide film, a silicon oxide film of approximately 100 nm is formed on a silicon substrate, so as to measure an IR spectrum. FIG. 5 is a diagram showing an IR spectrum of the silicon oxide film.

As shown in FIG. 5, a result of the measurement shows that the silicon oxide film has three peaks as oscillations of Si—O—Si. Specifically, it is possible to recognize: Si—O—

Si (rocking vibration) in 480 cm$^{-1}$(A); Si—O—Si (bending vibration) in 780 cm$^{-1}$(B); and Si—O—Si (stretching vibration) in 1080 cm$^{-1}$(C).

Figure 6:
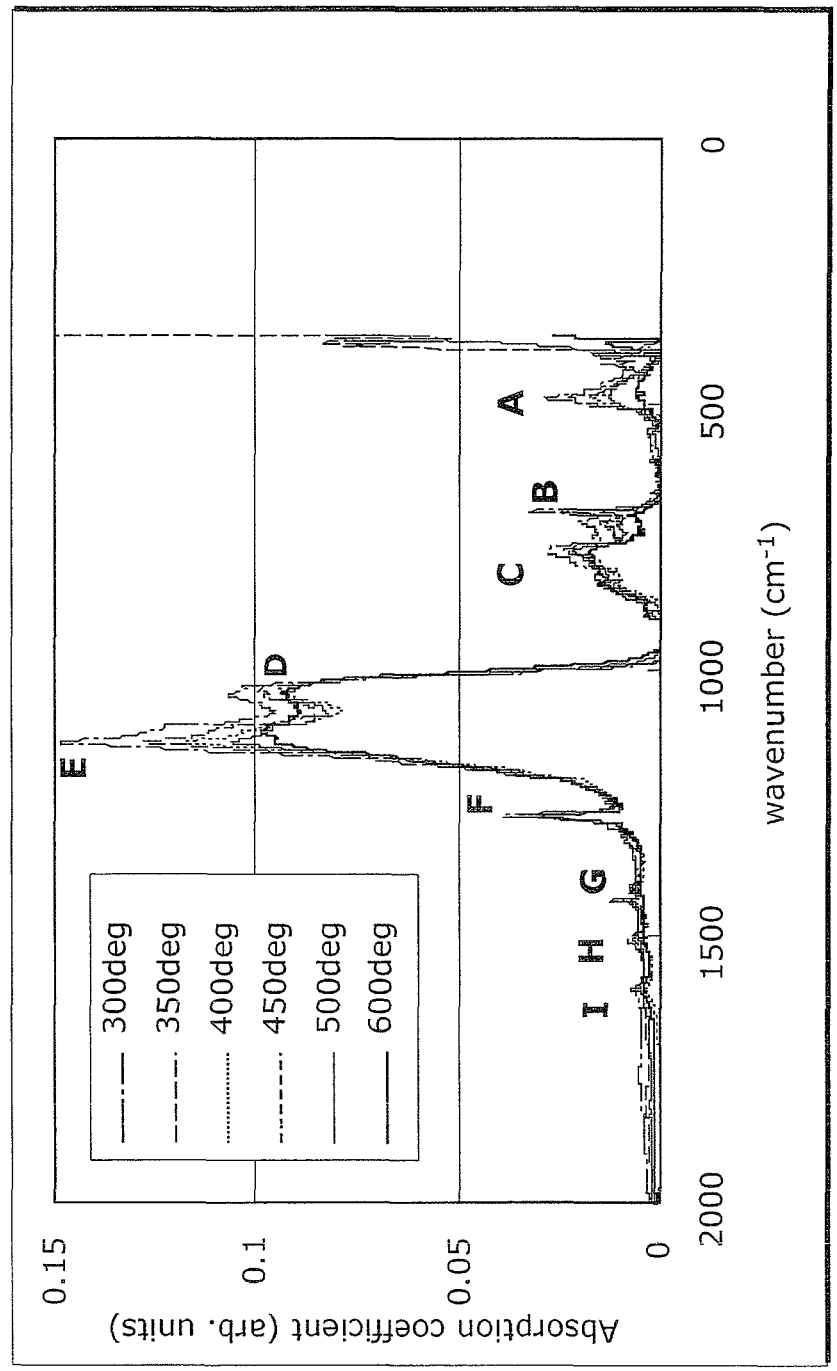
FIG. 6 is a diagram showing an IR spectrum of an organic film.

Next, to search the chemical structure of the organic film, an organic film is formed on the silicon substrate, using an organic material having a thickness of approximately 100 nm, so as to measure an IR spectrum. In addition, for the organic film that is to be solidified by heat treatment, the dependence of the organic film on the temperature in the IR spectrum of the organic film is also studied. FIG. 6 is a diagram showing an IR spectrum of an organic film. Note that the organic film is formed using the organic material that is used for the channel protection film 5 in the present embodiment described above. In addition, the organic film is baked for 20 minutes.

As shown in FIG. 6, a result of the measurement shows that the organic film has nine peaks from A to I. Specifically, it is possible to recognize: Si—O—Si (rocking vibration) in 480 cm$^{-1}$(A); C-H (bending (aromatic)) in 700 cm$^{-1}$(B); and Si—O—Si (bending) in 780 cm$^{-1}$(C); Si—O—Si (stretching) in 1080 cm$^{-1}$(D); Si-phenyl in 1130 cm$^{-1}$(E); Si—CH$_3$ (bending) in 1280 cm$^{-1}$(F); Si-phenyl in 1430 cm$^{-1}$(G); C—C (stretching (aromatic)) in 1500 cm$^{-1}$(H); and C—C (stretching (aromatic)) in 1580 cm$^{-1}$(I).

In addition, the measurement is performed with the baking temperature being changed within a temperature range of 300 degrees to 600 degrees, so as to recognize that: as shown in FIG. 6, as the baking temperature rises, Si—O—Si bonding increases while the Si—OH bonding and SI-phenyl bonding decrease.

Based on the results shown in FIGS. 5 and 6, the inventors of the present disclosure have learned that heating the organic film can approximate the stoichiometry of the organic film to the stoichiometry of the inorganic film.

However, as shown in FIG. 6, it is shown that a considerable amount of an organic component remains even after the heat treatment at 600 degrees. Thus, it is possible to consider that performing heat treatment on the organic film at 600 degrees or higher might allow further mineralizing the organic film; however, when the baking temperature is set to 600 degrees or higher, the glass substrate is dissolved, so that it is difficult to set the baking temperature to 600 degrees or higher. In addition, when the baking temperature is set to 600 degrees or higher, it is not possible to manufacture the thin-film transistor using a low-temperature process for which an upper limit of the temperature is approximately 400 degrees. Note that considering that a baking temperature of approximately 400 degrees at a maximum is sufficient for baking the channel protection film of the organic film, it is not preferable to set the baking temperature to 600 degrees or higher. Thus, since the entire substrate is exposed to high temperature during the baking, there is a limit in increasing the baking temperature.

Thus, the inventors of the present disclosure have considered increasing the temperature of the organic film to the high temperature of 600 degrees or higher by irradiating the organic film with a laser beam. With the laser beam, it is possible to locally increase the temperature of a portion irradiated with the laser beam, so that it is possible to manufacture, without dissolving the glass substrate, the thin-film transistor using the low-temperature process.

Figure 7:
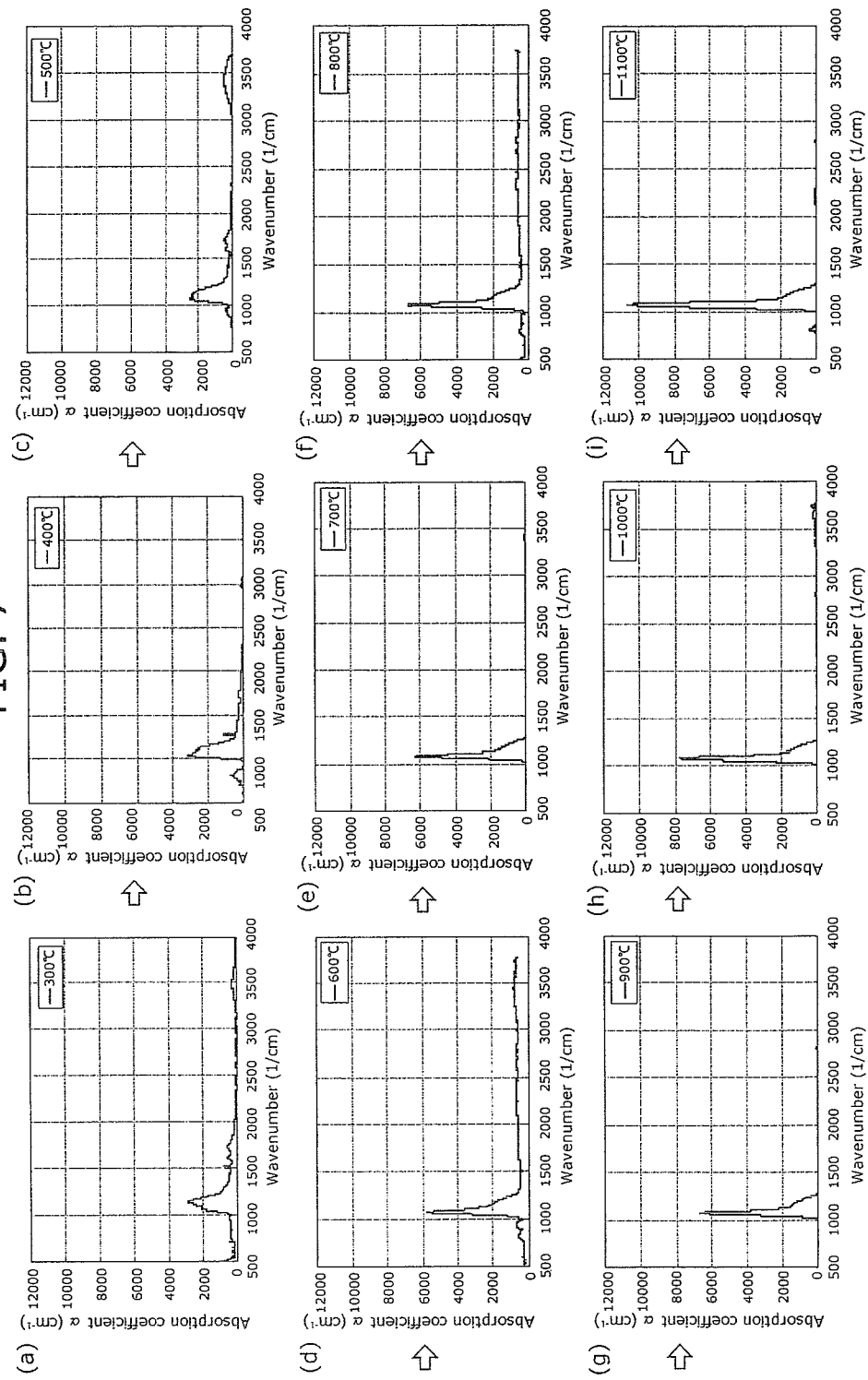
FIG. 7 is a diagram showing an IR spectrum of an organic film.

FIG. 7 is a diagram showing an IR spectrum of the organic film, and indicates a result of the IR measurement after performing heat treatment on the organic film for 5 minutes within a temperature range of 300 degrees to 1100 degrees. Note that the organic film in FIG. 7 contains an organic material (material A) including siloxane as a main skeleton.

As shown in FIG. 7, it is clear that: as the temperature increases, a vibration mode derived from an organic substance such as Si—CH$_3$ (bending) that peaks in 1280 cm$^{-1}$ disappears, and Si—O—Si (stretching) that peaks in 1080 cm$^{-1}$ increases to indicate an increase in SiO bonding. Particularly, the spectrum rapidly changes between 500 degrees and 600 degrees. (a) in FIG. 8A and (a) in FIG. 8B are enlarged views of (c) and (d) in FIG. 7, respectively. (b) in FIG. 8A and (b) in FIG. 8B are enlarged views of regions surrounded by dashed lines in (a) in FIG. 8A and (a) in FIG. 8B, respectively.

FIGS. 8A and 8B show a rapid increase in absorption coefficient between 500 degrees and 600 degrees as well as a rapid decrease in half-value width. Thus, according to the present embodiment, the organic film is determined as being mineralized when: within a range from 500 degrees to 600 degrees in which the IR spectrum of the organic film rapidly changes, the half-value width of the peak in the 1080 cm$^{-1}$ is (60 cm$^{-1}$+170 cm$^{-1}$)/2=115 cm$^{-1}$ or less.

Figure 9A:
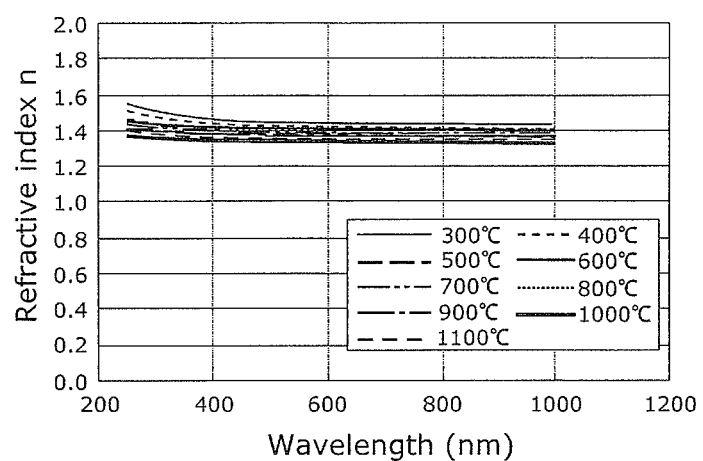
FIG. 9A is a diagram showing a dependence of a refractive index on a wavelength and a temperature (with a horizontal axis indicating the wavelength), when an organic film formed of a material A is heat processed.
Figure 9B:
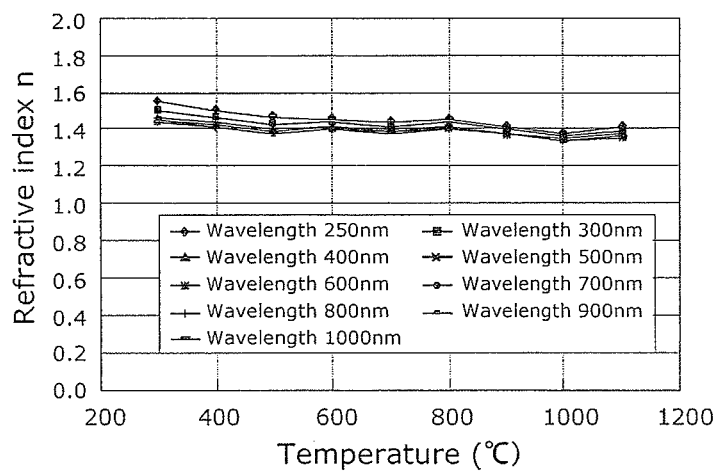
FIG. 9B is a diagram showing a dependence of a refractive index on the wavelength and the temperature (with a horizontal axis indicating the temperature), when an organic film formed of the material A is heat processed.
Figure 10A:
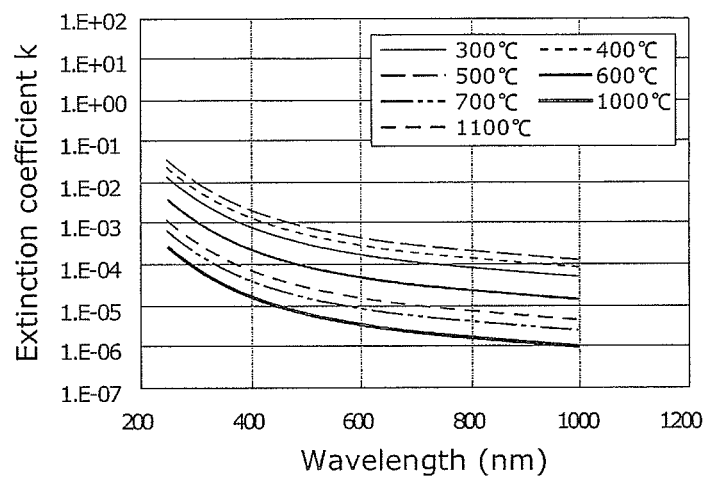
FIG. 10A is a diagram showing a dependence of an extinction coefficient on the wavelength and the temperature (with a horizontal axis indicating the wavelength), when an organic film formed of the material A is heat processed.
Figure 10B:
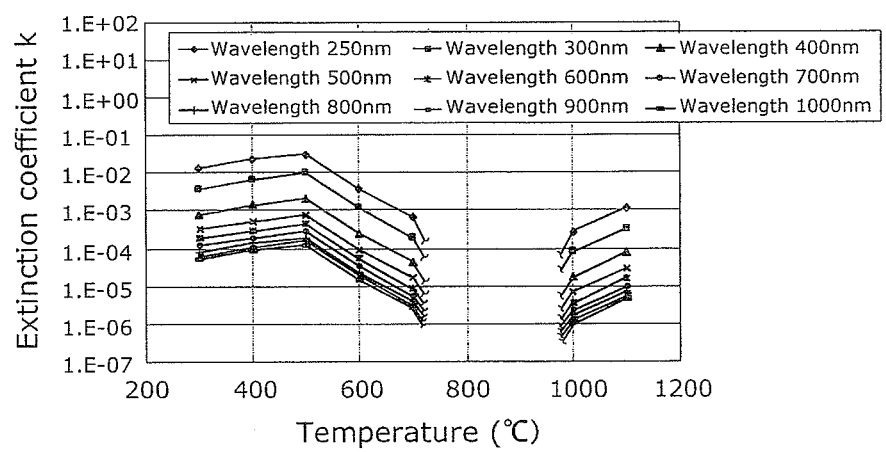
FIG. 10B is a diagram showing a dependence of an extinction coefficient on the wavelength and the temperature (with a horizontal axis indicating the temperature), when an organic film formed of the material A is heat processed.

Next, optical characteristics for the laser beam in the organic film formed using the organic material (material A) will be described with reference to FIGS. 9A, 9B, 10A, and 10B. FIGS. 9A and 9B are diagrams showing dependences of the refractive index of the organic film on the wavelength and on the heat treatment temperature, showing a relationship between the wavelength of the laser beam used for irradiation, the heat treatment temperature for the organic film, and the refractive index of the organic film. In addition, FIGS. 10A and 10B are diagrams showing a dependence of the extinction coefficient on the wavelength and the temperature for heat treatment, showing a relationship between the wavelength of the laser beam used for irradiation, the heat treatment temperature for the organic film, and the extinction coefficient of the organic film. Note that FIG. 9B is different from FIG. 9A only in the parameter for the horizontal axis, and shows the same characteristics as FIG. 9A. Likewise, FIG. 10B shows the same characteristics as FIG. 10A.

First, as shown in FIGS. 9A and 9B, as the heating temperature for the organic film increases, the refractive index decreases to approach the refractive index of silicon oxide (n=1.4). In other words, in terms of the refractive index, it is clear that heating the organic film using the laser beam allows approximating the organic film to the silicon oxide film.

In addition, FIGS. 10A and 10B show that the extinction coefficient decreases as the heating temperature for the organic film increases. In other words, it is possible to transparentize the organic film by heating the organic film with a laser beam. Note that in FIGS. 10A and 10B, the data for the temperature range of approximately 800 degrees to 900 degrees is not plotted because a detection limit of the measurement apparatus is exceeded. Within this range, the extinction coefficient has a small value that is $1 \times 10^{-7}$ cm$^{-1}$ or less. Note that a spectroscopic ellipsometer is used as the measurement apparatus.

Figure 11A:
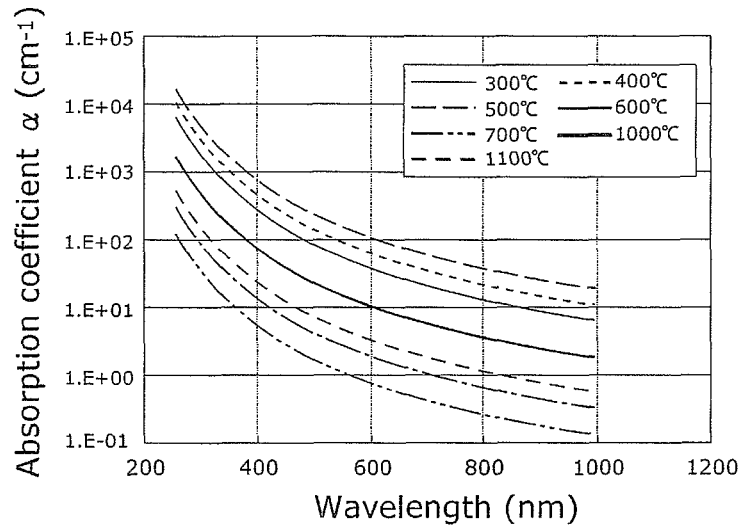
FIG. 11A is a diagram showing a dependence of an absorption coefficient on the wavelength and the temperature (with a horizontal axis indicating the wavelength), when an organic film formed of the material A is heat processed.
Figure 11B:
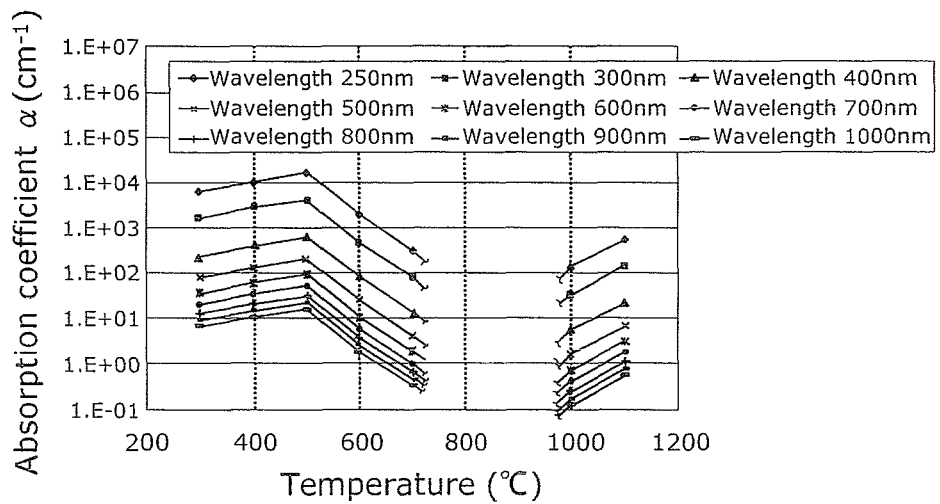
FIG. 11B is a diagram showing the dependence of the absorption coefficient on the wavelength and the temperature (with a horizontal axis indicating the temperature), when an organic film formed of the material A is heat processed.

In addition, since absorption coefficient α can be represented as $\alpha = 4\pi k/\lambda$ where the incident wavelength is λ and the extinction coefficient is k, the characteristics of the extinction coefficient shown in FIGS. 10A and 10B can also be represented as the characteristics of the absorption coefficient, thus producing the results shown in FIGS. 11A and 11B. FIGS. 11A and 11B are diagrams showing the dependence of the absorption coefficient of the organic film on the wavelength and temperature for heat treatment, showing a relationship between the wavelength of the laser beam used for laser irradiation, the heat treatment temperature for the organic film, and the absorption coefficient of the organic film. Note that FIG. 11B is different from FIG. 11A only in the parameter for the horizontal axis, and shows the same characteristics as FIG. 11A.

FIGS. 11A and 11B show that the absorption coefficient of the organic film (material A) increases constantly or slightly up to 500 degrees, but decreases by one or more digit when the temperature increases from 500 degrees to 600 degrees. In addition, it is shown that when the temperature further increases over 600 degrees, the absorption coefficient further decreases. Note that in FIGS. 11A and 11B, the data is not plotted for a temperature range of approximately 800 degrees to approximately 900 degrees, but as with the case of FIG. 10B, the absorption coefficient in practice is an infinitely small value which is $1\times10^{-1}$ cm$^{-1}$ or less.

As described above, it is shown that laser irradiation increases the temperature of the organic film and accordingly reduces the absorption coefficient to transparentize the organic film. In addition, as a result of the increase in the temperature of the organic film, the vibration mode derived from the organic substance disappears while SiO bonding increases, so that the organic film becomes mineralized.

Figure 12A:
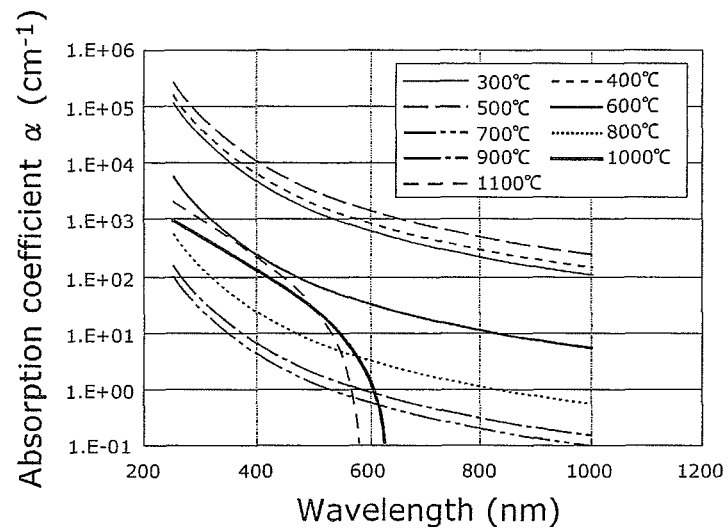
FIG. 12A is a diagram showing the dependence of an absorption coefficient on the wavelength and the temperature (with a horizontal axis indicating the wavelength), when an organic film formed of a material B is heat processed.
Figure 12B:
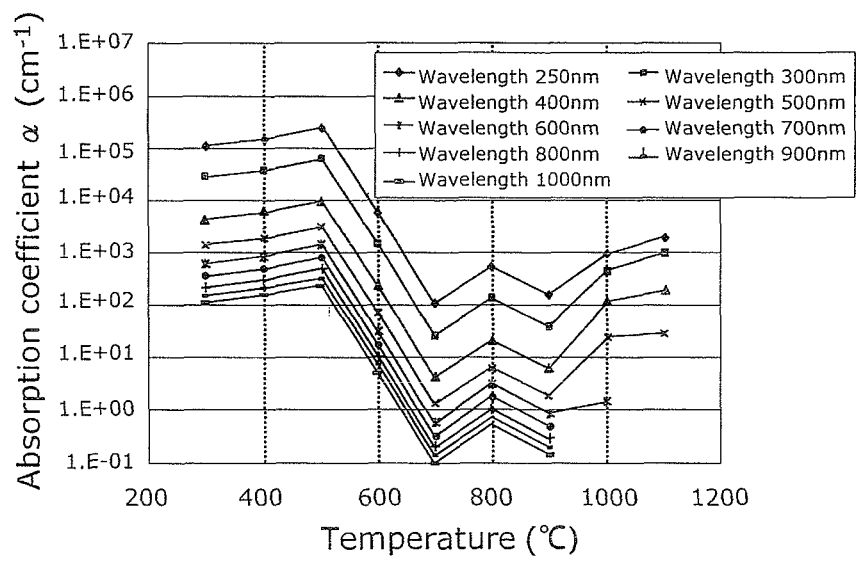
FIG. 12B is a diagram showing the dependence of the absorption coefficient on the wavelength and the temperature (with a horizontal axis indicating the temperature), when an organic film formed of the material B is heat processed.
Figure 13A:
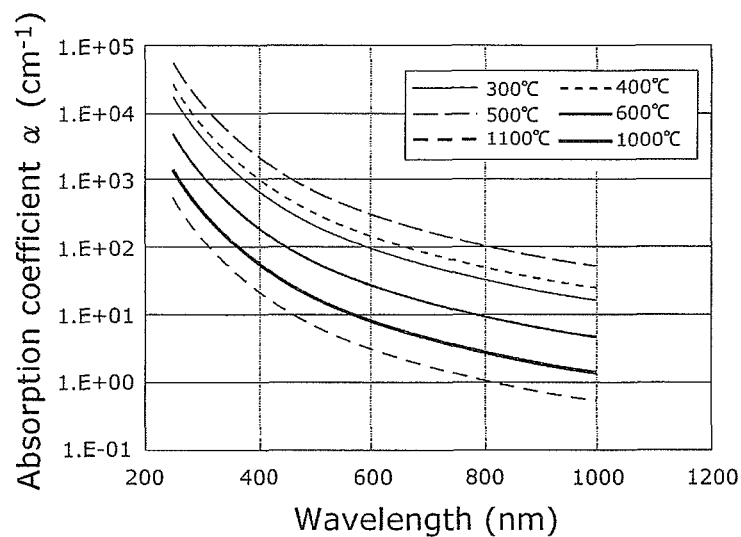
FIG. 13A is a diagram showing the dependence of the absorption coefficient on the wavelength and the temperature (with a horizontal axis indicating the wavelength), when an organic film formed of a material C is heat processed.
Figure 13B:
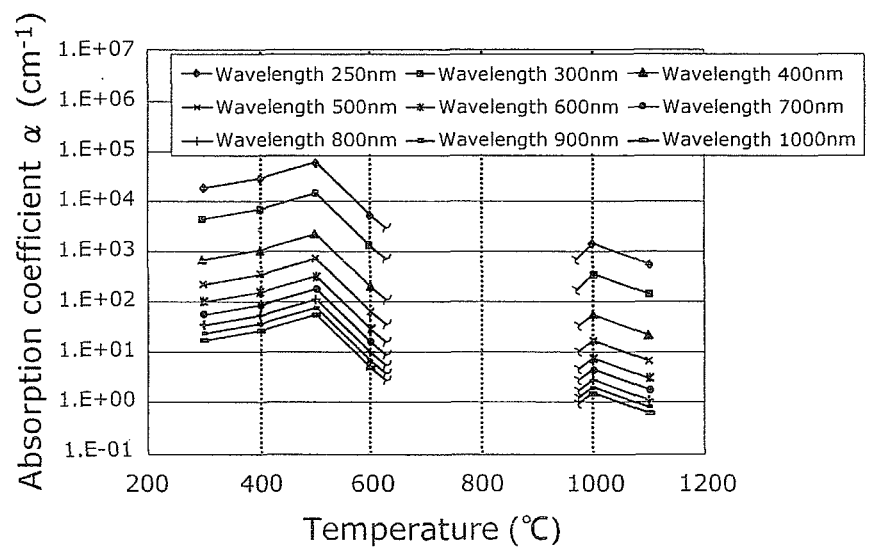
FIG. 13B is a diagram showing the dependence of the absorption coefficient on the wavelength and the temperature (with a horizontal axis indicating the temperature), when an organic film formed of the material C is heat processed.

Next, described is the result of changing the material for the organic film and measuring a dependence of the absorption coefficient on the wavelength and the temperature of the organic film in the same manner as in FIGS. 11A and 11B. FIGS. 12A and 12B show the dependence of the absorption coefficient of the organic film on the wavelength and the temperature for heat treatment when performing the heat treatment on the organic film formed of a material B. FIGS. 13A and 13B show the dependence of the absorption coefficient of the organic film on the wavelength and the temperature for the heat treatment when performing the heat treatment on the organic film formed of a material C. Note that FIGS. 12B and 13B are different from FIGS. 12A and 13A, respectively, only in parameter in the horizontal axis, and have the same characteristics as in FIGS. 12A and 12B.

Here, the material B, as with the material A, is an organic material including siloxane as a main skeleton. In addition, the material C is an organic material including Silsesquioxane as a main skeleton. Note that the other components of the materials B and C are the same as the material A.

As shown in FIGS. 12A and 12B, it is shown that the absorption coefficient of the organic film (material B), as with the organic film (material A), increases constantly or slightly up to 500 degrees, but decreases by one or more digit when the temperature rises from 500 degrees to 600 degrees. In addition, when the temperature exceeds 600 degrees to be higher, it is shown that the absorption coefficient further decreases.

In addition, as shown in FIGS. 13A and 13B, it is clear that the absorption coefficient of the organic film (material C), as with the organic film (material A), increases constantly or slightly up to 500 degrees, but decreases by one or more digit when the temperature rises from 500 degrees to 600 degrees. In addition, when the temperature exceeds 600 degrees to be higher, it is shown that the absorption coefficient further decreases. Note that in FIGS. 13A and 13B, the data is not plotted within the temperature range of approximately 700 degrees to approximately 900 degrees, but as with FIG. 11B, the absorption coefficient in practice is an infinitely small value, which is $1\times10^{-1}$ cm$^{-1}$ or less.

As described above, even if the organic film is formed of a different organic material, laser irradiation increases the temperature, and this accordingly decreases the absorption coefficient, thus transparentizing the organic film. In addition, it is shown that an increase in the temperature of the organic film causes the vibration mode derived from the organic substance to disappear as well as increasing bonding of SiO, thus mineralizing the organic film.

In addition, use of different materials for the organic film also allows changing the absorption coefficient with respect to the wavelength of the laser beam. This allows selecting the wavelength of the organic material and the laser beam so that the organic film becomes opaque (colored) before irradiation of the laser beam and becomes transparent after irradiation of the laser beam.

In the present embodiment, by irradiating, with the laser beam, the opaque organic film 5a that is the precursor of the channel protection film 5, the organic film 5a is transparentized to be formed into the channel protection film 5, and the amorphous semiconductor thin film 4a under the channel protection film 5 is crystallized at the same time. Accordingly, it is preferable to select the material for the organic film 5a and the wavelength of the laser beam such that the transmittance before the laser irradiation is below 37% and the transmittance after the laser irradiation is 37% or more.

Here, the transmittance T of the organic film is represented by $T=I/I_o$, and can further be represented by $T=I/I_o=\exp(-\alpha t)$, using the absorption coefficient $\alpha$ of the organic film and the film thickness t of the organic film. In the present embodiment, assuming the case where the organic film is opaque when a product of the absorption coefficient $\alpha$ of the organic film and the film thickness t of the organic film is greater than 1, the transmittance T which produces $-\alpha t=-1$ is $T=\exp(-1)=0.36789\approx37\%$, so that the transmittance is below 37%. On the other hand, assuming the case where the organic film is transparent when the product of the absorption coefficient $\alpha$ of the organic film and the film thickness t is 1 or less, the transmittance in this case is 37% or more. Note that the absorptance can be represented by 1−transmittance (T).

Figure 14:
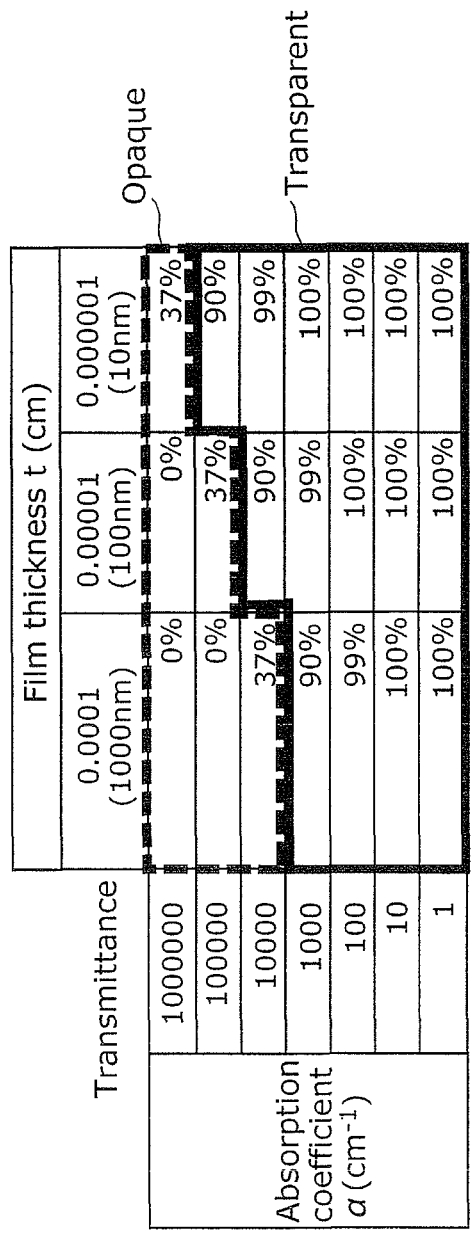
FIG. 14 is a diagram showing the transmittance of the organic film in relation to the absorption coefficient of the organic film and a thickness of the organic film.

FIG. 14 is a diagram showing a relationship between the absorption coefficient $\alpha$ (cm$^{-1}$) of the organic film and the transmittance of the organic film with respect to the film thickness t (cm) of the organic film. As shown in FIG. 14, according to the present embodiment, the organic film is assumed to be opaque when the transmittance of the organic film is below 37%, and is assumed to be transparent when the transmittance of the organic film is 37% or more.

This allows, using FIG. 14 and FIGS. 11A to 13B, selecting an organic material, a wavelength of the laser beam, and a laser irradiation condition (heating temperature) that are desired such that the organic film, which is opaque before irradiation of the laser beam, becomes transparent after irradiation of the laser beam.

As described above, with the thin-film semiconductor device 10 according to the present embodiment, by irradiating, with a desired laser beam, the organic film 5a formed on the amorphous semiconductor thin film 4a, it is possible to transparentize the organic film 5a by increasing the transmittance of the organic film 5a as well as mineralizing the organic film 5a by increasing the temperature of the organic film 5a. In addition, in the present embodiment, the laser beam is transmitted as a result of transparentizing the organic film 5a, thus crystallizing the amorphous semiconductor thin film 4a under the organic film 5a. In this case, a heat generated at the time of crystallization of the amorphous semiconductor thin film 4a is conducted to the organic film 5a, and this heat also causes the temperature of the organic film 5a to increase, thus mineralizing the organic film 5a. In other words, in the present embodiment, the organic film 5a is mineralized due to heat generation in the organic film 5a itself caused by absorption of the laser beam and heat generation at the time of crystallization of the amorphous semiconductor thin film 4a.

Thus, in the present embodiment, it is possible to form the channel protection film 5 that is transparentized and mineralized.

Figure 15A:
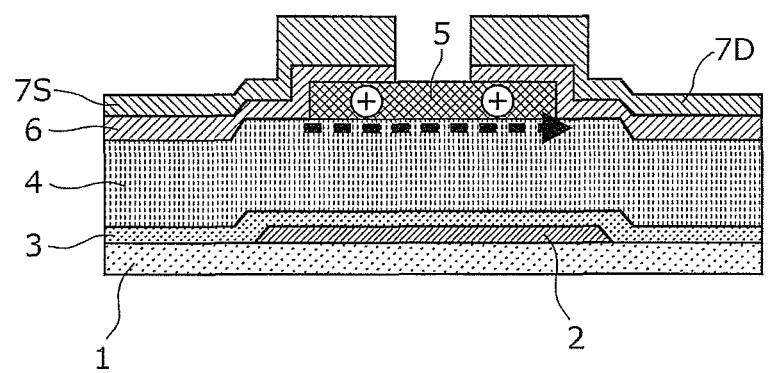
FIG. 15A is a diagram for describing an advantageous effect of a thin-film semiconductor device according to a first embodiment of the present disclosure.

Thus, as shown in FIG. 15A, the fixed charge of the channel protection film 5 decreases as a result of mineralizing the channel protection film 5, thus suppressing generation of the back channel. This allows realizing the thin-film semiconductor device having an advantage in OFF characteristics.

Figure 15B:
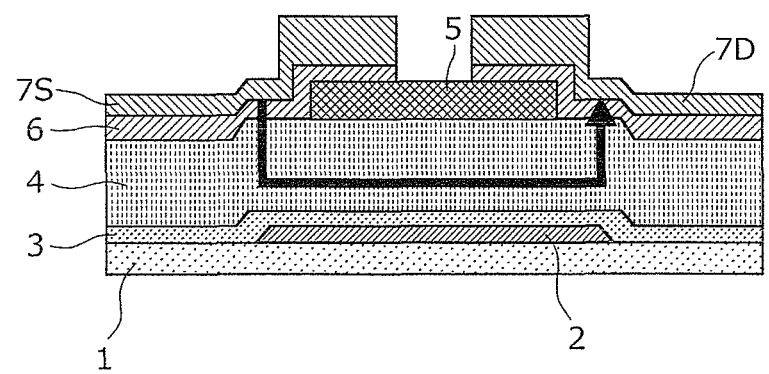
FIG. 15B is a diagram for describing an advantageous effect of the thin-film semiconductor device according to the first embodiment of the present disclosure.

In addition, as a result of mineralizing the channel protection film 5, as shown in FIG. 15B, it is possible to reduce the trap levels in the channel protection film 5, thus suppressing trapping of carriers in the channel protection film 5. Since this allows suppressing the shift of the threshold voltage in the thin-film semiconductor device, it is possible to realize a thin-film semiconductor device having high reliability and high in-plane uniformity.

Note that in the present embodiment, it is preferable that the film thickness of the channel protection film 5 be set within the range as described below.

Figure 16:
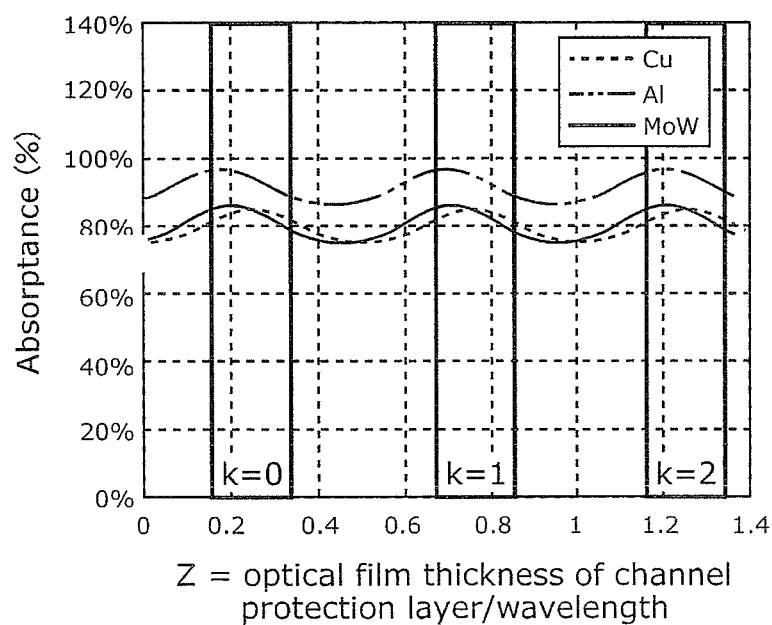
FIG. 16 is a diagram showing a change in absorptance of a noncrystalline semiconductor thin film in the case of changing a film thickness of the channel protection film.

FIG. 16 shows a change in the absorptance of the amorphous semiconductor thin film 4a in the case of changing the film thickness of the channel protection film 5. Note that in FIG. 16, the horizontal axis indicates the value obtained by dividing an optical thickness of the channel protection film 5 by the wavelength of the laser beam, and the vertical axis represents the absorptance of the amorphous semiconductor thin film 4a. In addition, in the calculation as shown in FIG. 16, a model is used in which: the gate insulating film 3 is formed of silicon oxide; a value obtained by dividing, by the wavelength of the laser beam, the value that is obtained by multiplying the film thickness of the gate insulating layer 3 by the refractive index of the gate insulating layer 3 is 0.276 (corresponding to a film thickness of the silicon oxide layer of 100 nm at a wavelength of 532 nm); a value obtained by dividing, by the wavelength of the laser beam, a value that is obtained by multiplying the optical film thickness of the semiconductor thin film 4a (amorphous silicon thin film) under the channel protection film 5 is 0.477 (corresponding to a film thickness of the amorphous silicon layer of 50 nm at a wavelength of 532 nm); and the channel protection film 5 is formed of silicon oxide. In addition, a dashed line, a two-dot chain line, and a solid line represents a result of the calculation when the gate electrode 2 is Cu, Al, and MoW, respectively.

As shown in FIG. 16, when Z is the value obtained by dividing the optical film thickness of the channel protection film 5 by the wavelength of the laser beam, k is an integer starting from 0, and if Z satisfies (Expression 1) below, it is possible to increase the absorption efficiency of the laser beam in the amorphous semiconductor thin film 4a. Note that each of k=0, 1, 2 in FIG. 16 shows a range of Z where k=0, 1, 2 in (Expression 1).

$$0.5 \times (k+0.3) \leq Z \leq 0.5 \times (k+0.7) \quad \text{(Expression 1)}$$

Thus, by setting the film thickness of the channel protection film 5 to satisfy the condition in (Expression 1), it is possible to increase the absorption efficiency of the laser beam in the amorphous semiconductor thin film 4a under the channel protection film 5, so that it is possible to efficiently perform heat treatment on the region under the channel protection film 5 and efficiently crystallize the noncrystalline semiconductor thin film as well as efficiently transparentizing the channel protection film 5 through heat conduction from the semiconductor thin film. This allows realizing the thin-film semiconductor device having an advantage in OFF characteristics.

In addition, in the present embodiment, in (e) in FIG. 2, the organic film 5a is prebaked, but at this time, there is a case where an interface layer 50 is generated between the noncrystalline semiconductor thin film 4a and the organic film 5a. The interface layer 50 includes carbon as main component, and the main component carbon is carbon derived from an organic material of the organic film 5a.

Figure 17A:
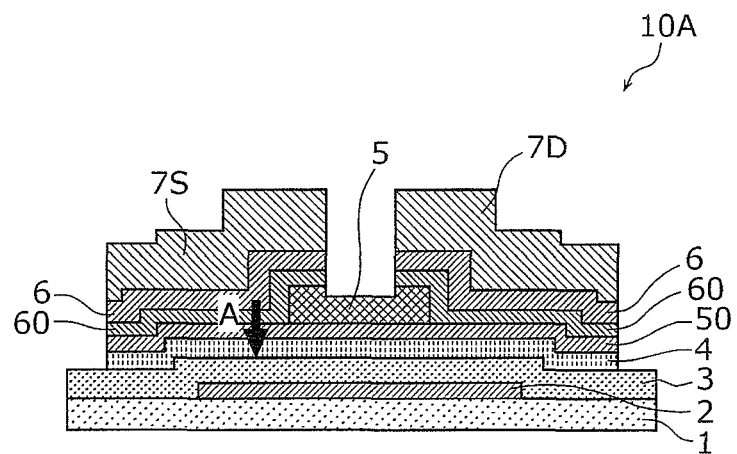
FIG. 17A is a cross-sectional view showing a configuration of the thin-film semiconductor device according to the first embodiment in the case of forming an interface layer.

FIG. 17A is a cross-sectional diagram showing a configuration of a thin-film semiconductor device 10A according to the first embodiment of the present disclosure when the interface layer 50 is formed.

As shown in FIG. 17A, the interface layer 50 is formed between the channel layer 4 and the channel protection film 5. The interface layer 50 is an insulating film having insulation properties, and it is preferable to set the resistivity of the interface layer 50 to $2 \times 10^6$ ($\Omega \cdot$cm) or higher.

In addition, as shown in FIG. 17A, in the thin-film semiconductor device 10A, a pair of noncrystalline silicon thin films 60 are formed between the interface layer 50 and the contact layer 6. The noncrystalline silicon thin film 60 is formed of amorphous silicon film, and is an i layer which is not purposely doped with impurity. Accordingly, the noncrystalline silicon thin film 60 has an electrical resistance higher than the electrical resistance of the contact layer 6 doped with impurity. However, the noncrystalline silicon thin film 60 contains impurity that is naturally contained, and an impurity concentration of the noncrystalline silicon thin film 60 is $1 \times 10^{17}$ (atm/cm$^3$) or less.

Figure 18A:
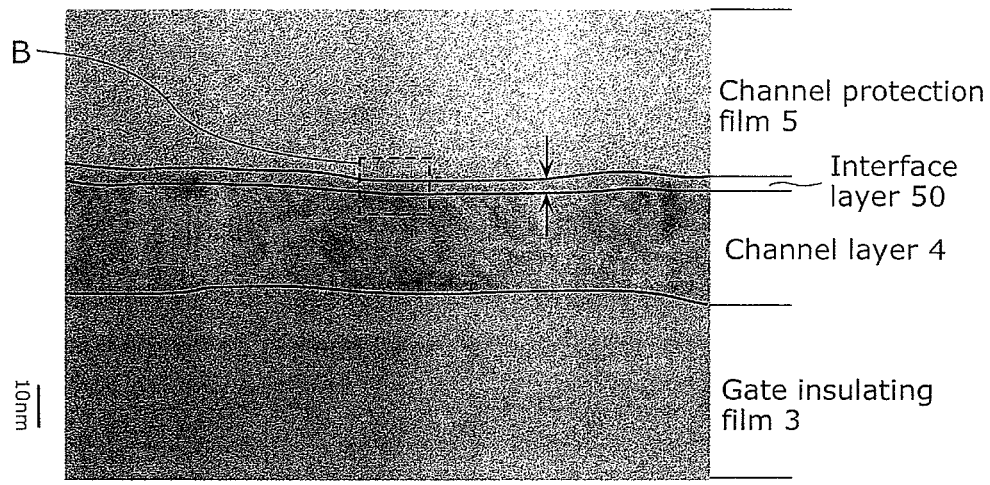
FIG. 18A is a cross-sectional transmission electron microscope (TEM) image around the interface layer in the thin-film semiconductor device shown in FIG. 17A.

Next, a configuration of the interface layer 50 in a thin-film semiconductor device 10A shown in FIG. 17A will be described with reference to FIGS. 18A and 18B. FIG. 18A is a cross-sectional TEM image around the interface layer of the thin-film semiconductor device shown in FIG. 17A. In addition, FIG. 18B is a schematic diagram for describing a cross-sectional structure of a region B surrounded by a dotted line in FIG. 18A.

FIG. 18A shows that the interface layer 50 which is an ultrathin layer is formed between the channel layer 4 and the channel protection film 5. In addition, FIG. 18A also shows that the interface layer 50 having a film thickness of approximately 2 nm is formed.

Figure 18B:
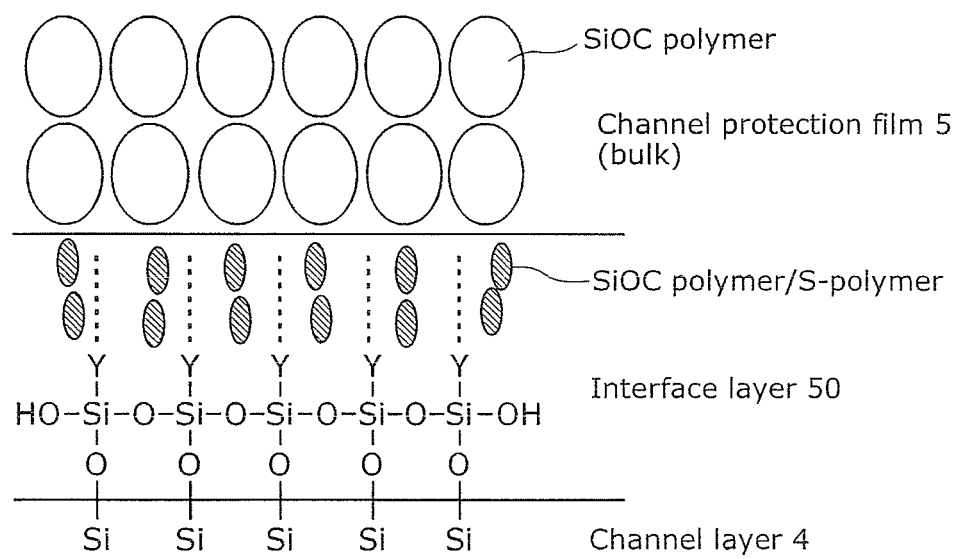
FIG. 18B is a schematic view for describing a cross-sectional structure of region B surrounded by a dashed line in FIG. 18A.

The interface layer 50, as described above, is a layer generated when solidifying the channel protection film 5 by heating, and as shown in FIG. 18B, a channel layer 4 side of the interface layer 50 is in a state where a silicon compound of a surfactant included in the material of the organic film 5a that is a precursor of the channel protection film 5 and a silicon atom of the channel layer 4 are bonded.

Specifically, as shown in FIG. 18B, an interface between the interface layer 50 and the channel layer is in a state where Y—Si—(O)$_3$ and the crystalline silicon thin film are bonded, and therefore includes Si—O—Si bonding. Note that Y in Y—Si—(O)$_3$ is a functional group which binds an organic material by reaction bonding, and is an amino group, an epoxy group, a methacryl group, a vinyl group, a mercapto group, and so on.

In addition, the channel protection film 5 side of the interface layer 50 is in a state where SiOC-derived polymer (thin film formed using at least Si, O, and C as main component atoms) and S(sulfur)-derived polymer (thin film including Si, O, C, and S) are included. The SiOC-derived polymer can be considered as being derived from the silicon compound in the surfactant included in the material of the organic film 5a and carbon included in the photosensitive organic resin material that have become polymerized. In addition, S-derived polymer is a thin film that is derived from a photosensitizer, a surfactant, and a photosensitizer included in the organic material of the organic film 5a that have become polymerized.

Thus, the interface layer 50 is considered to have a configuration in which Si—O—Si bonding and the polymer are compositely formed into a matrix. In addition, the channel protection film 5 made of bulk SiOC-derived polymer is disposed on the interface layer 50.

Note that FIG. 18A also shows that the interface layer 50 is formed of a material different from the channel layer 4 and the channel protection film 5. In other words, as shown in the TEM image in FIG. 18A, a layer having a different contrast can be observed between the channel layer 4 and the channel protection film 5. Note that the difference in contrast in the TEM image indicates different density of the material, which means the presence of different layers. Accordingly, between the channel layer 4 and the channel protection film 5, the interface layer 50 is interposed as a layer different from these layers.

Figure 19:
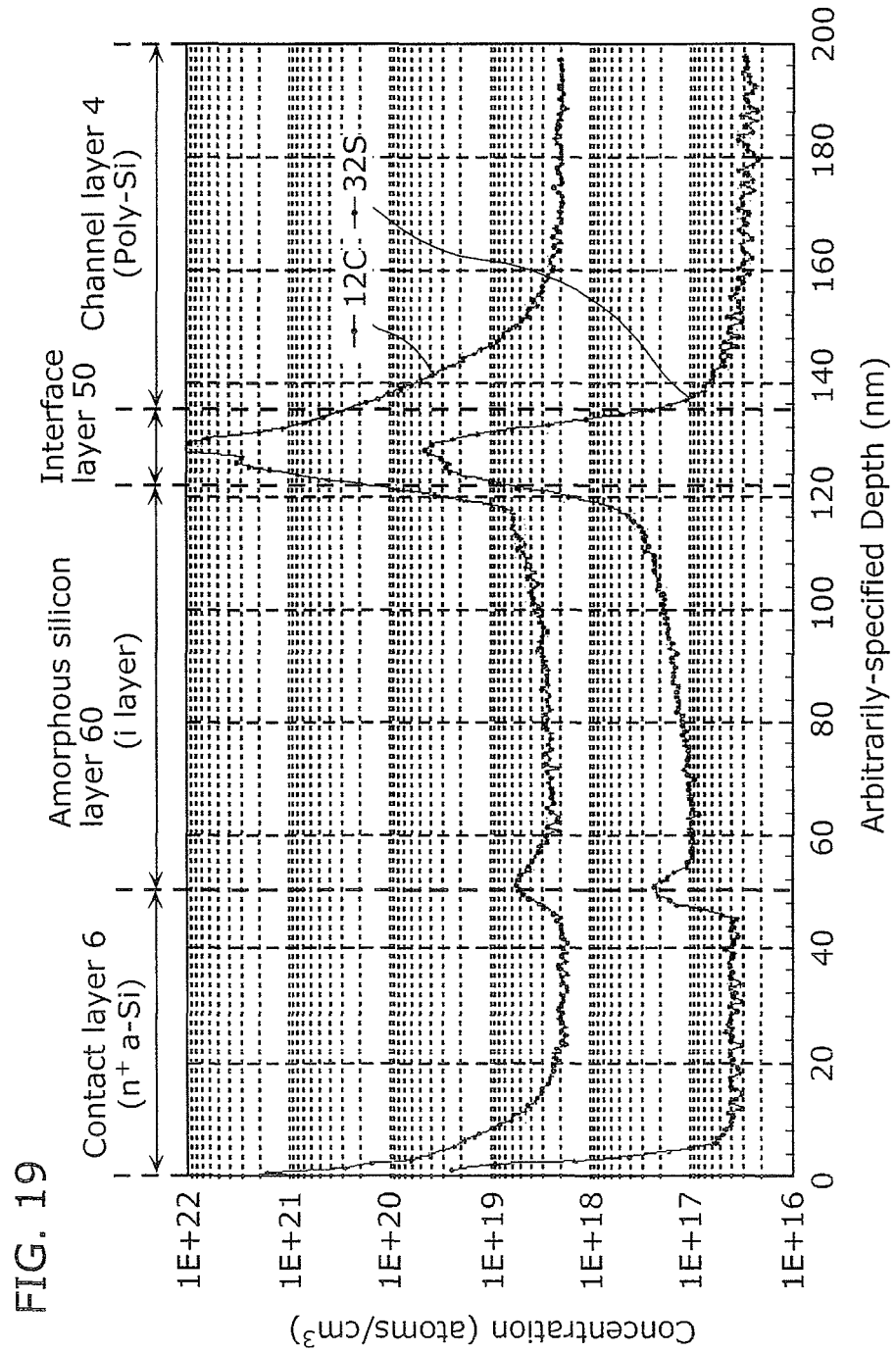
FIG. 19 is a diagram showing a concentration distribution of carbon and sulfur contained in a film included in the thin-film semiconductor device shown in FIG. 17A.

Next, a concentration distribution of carbon (C) and sulfur (S) in the thin-film semiconductor device 10A shown in FIG. 17A will be described with reference to FIG. 19. FIG. 19 is a diagram showing a concentration distribution of carbon and sulfur contained in a film included in the thin-film semiconductor device shown in FIG. 17A and in which the atom concentration in the thickness (depth) direction shown by an arrow A in FIG. 17A is measured and plotted by secondary ion mass spectrometry (SIMS).

In the thin-film semiconductor device 10A shown in FIG. 17A, FIG. 19 shows a result obtained by measuring the concentration of carbon and sulfur in the depth direction of the arrow A in the figure, that is, by measuring the concentration of carbon and sulfur in order of the contact layer 6, the noncrystalline silicon thin film 60, the interface layer 50, and the channel layer 4. Note that in FIG. 19 the curves represented by "12C" and "32S" represent a concentration distribution of carbon and sulfur, respectively.

As shown in FIG. 19, the interface layer 50 has a high carbon concentration and a high sulfur concentration compared to the other layers, and the concentration of carbon included in the interface layer 50 is $5 \times 10^{20}$ (atoms/cm$^3$) or more, and the sulfur concentration included in the interface layer 50 is $5 \times 10^{19}$ (atoms/cm$^3$) or more.

Furthermore, it is clear that the carbon concentration included in the interface layer 50 is 50 times or more higher than the carbon concentration as impurity included in the channel layer 4. In addition, it is clear that the sulfur concentration included in the interface layer 50 is 100 times or more higher than the sulfur concentration as impurity included in the channel layer 4.

The interface layer 50 thus formed includes carbon as a main component and thus includes more carbon than the channel layer 4. Thus, since the interface layer 50 including carbon as the main component in the interface between the projecting portion of the channel layer 4 and the channel protection film 5, it is possible to increase scattering in the interface between the channel protection film 5 and the channel layer 4, and the interface layer 50 functions as a barrier that blocks the carrier transfer. In other words, it is possible to increase the resistance value in the top portion of the channel layer 4. This allows decreasing carrier mobility within the backchannel region in the channel layer 4.

In addition, the sulfur included in the interface layer 50 is the sulfur included in the photosensitizer in the organic material for the channel protection film 5. In other words, the sulfur included in the interface layer 50 derives from the organic material of the channel protection film 5. Sulfur has an atomic radius larger than those of carbon and oxygen, and thus produces a larger effect of interrupting carrier transfer than those produced by carbon and oxygen. Accordingly, inclusion of sulfur in the interface layer 6 allows further reducing the carrier mobility as described above, thus further increasing the OFF characteristics of the thin-film semiconductor device.

With this, even if the fixed charge is generated in the channel protection film 5, the back channel conduction of the carrier can be suppressed through the scattering by the interface layer 50.

Figure 17B:
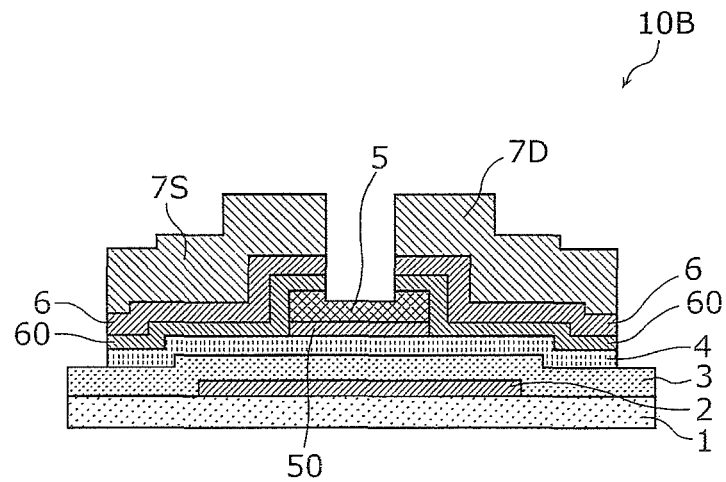
FIG. 17B is a cross-sectional view showing a configuration of another thin-film semiconductor device according to the first embodiment in the case of forming the interface layer.

Note that in the thin-film semiconductor device 10A shown in FIG. 17A, the interface layer 50 is purposely left on the entire surface of the interface layer 50 without being removed, for analyzing the component of the interface layer 50 in detail; however, in terms of increasing the TFT characteristics, it is preferable to sufficiently remove the interface layer 50 that remains in the electric path. In other words, in the thin-film semiconductor device 10A shown in FIG. 17A, there is the high-resistance interface layer 50 is between the contact layer 60 and the channel layer 4 that function as the current path, thus decreasing ON characteristics. Accordingly, in order to realize a thin-film semiconductor device having excellent ON characteristics, it is preferable, as with the thin-film semiconductor device 10B shown in FIG. 17B, that the high-resistance interface layer 50 not be interposed between the contact layer 60 and the channel layer 4 that are to be the current path by sufficiently removing, through development processing or etching processing when patterning the organic film 5a in a predetermined shape, the interface layer 50 having a possibility of being left as a residue.

As described above, in another thin-film semiconductor device 10B according to the first embodiment of the present disclosure, since the interface layer 50 including carbon as the main component between an upper portion of the channel layer 4 and the channel protection film 5 is formed, it is possible to reduce the carrier mobility in the back channel region of the channel layer 4. This allows suppressing the leakage current at OFF time, thus improving OFF characteristics.

Embodiment 2

Figure 20:
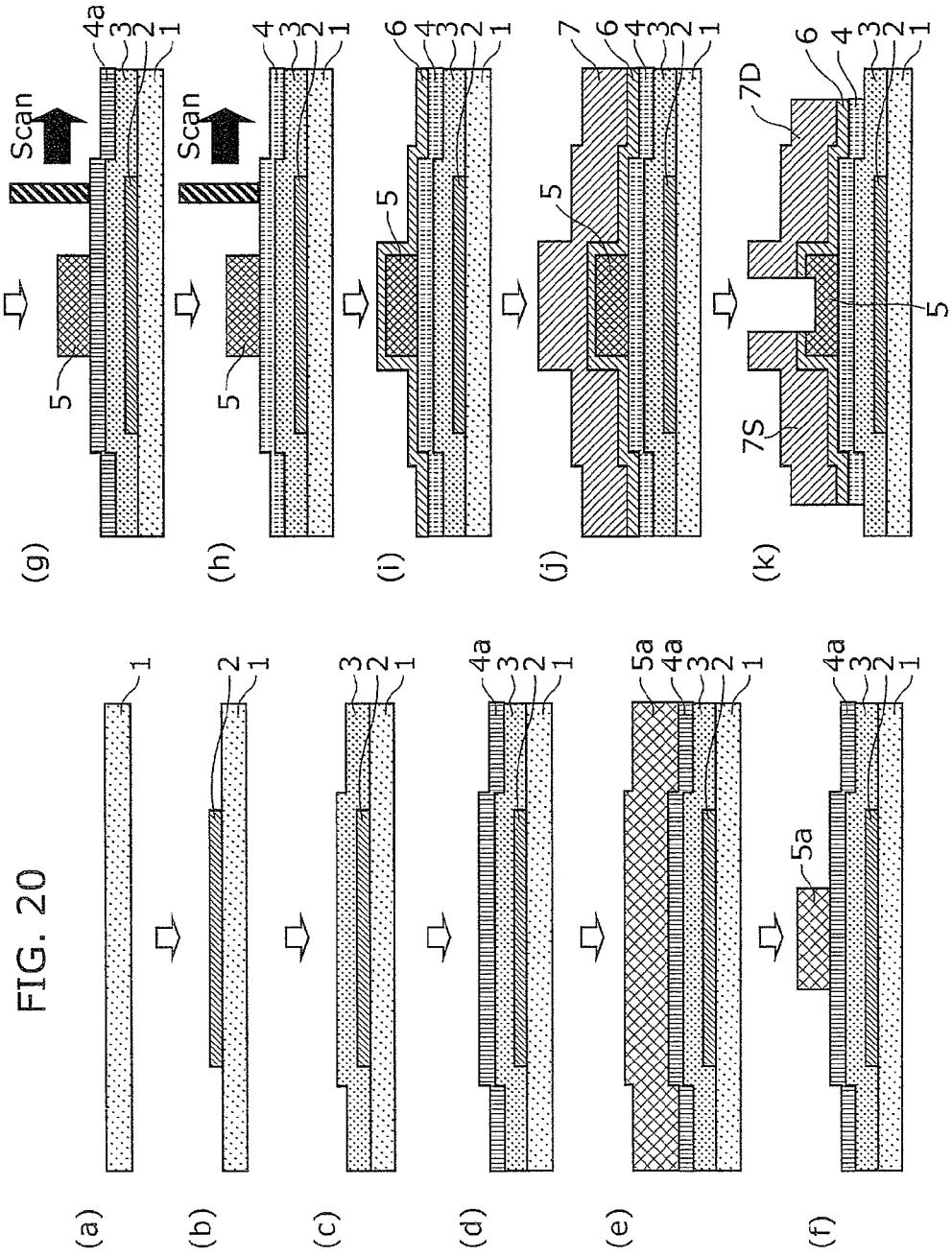
FIG. 20 is a cross-sectional view for describing a method of manufacturing a thin-film semiconductor device according to a second embodiment of the present disclosure.

Next, the method of manufacturing a thin-film semiconductor device according to a second embodiment of the present disclosure will be described with reference to FIG. 20. FIG. 20 is a cross-sectional diagram for describing the method of manufacturing the thin-film semiconductor device according to the second embodiment of the present disclosure. Note that in FIG. 20, the same constituent element as the constituent element shown in FIG. 2 is assigned with the same numerical reference.

The thin-film semiconductor device manufactured by the manufacturing method according to the present embodiment as the same configuration as that of the thin-film semiconductor device 10 according to the first embodiment. In other words, the present embodiment is different from the first embodiment in the manufacturing method.

Specifically, in the manufacturing method according to the first embodiment, by irradiating the organic film 5a with one laser shot as shown in (f) in FIG. 2, the organic film 5a is transparentized and mineralized while at the same time crystallizing the noncrystalline semiconductor thin film 4a; whereas, in the present embodiment, the process of transparentizing and mineralizing the organic film 5a and the process of crystallizing the noncrystalline semiconductor thin film 4a are performed separately.

Hereinafter, a specific method of manufacturing the thin film semiconductor device according to the present embodiment will be described with reference to FIG. 2.

First, as shown in (a) to (e) in FIG. 20, the same processing as (a) to (e) in FIG. 2 is performed. With this, the organic film 5a patterned into a predetermined shape is formed on the noncrystalline semiconductor thin film 4a as shown in FIG. 20(e).

Next, as shown in (g) in FIG. 20, the organic film 5a is irradiated with a laser beam to transparentize and mineralize the organic film 5a. With this, the organic film 5a absorbs energy of the laser beam to cause photoreaction or thermal reaction, the quality of the organic film 5a is modified to be transparentized, from opaque into transparent. At the same time, the organic film 5a absorbs energy of the laser beam to cause photoreaction or thermal reaction, so that the organic film 5a becomes mineralized. Thus formed is the channel protection film 5 that is transparentized and mineralized.

In this case, a level of transparentization and mineralization of the organic film 5a is determined by the temperature and so on of the organic film 5a. Specifically, the level is determined according to the temperature shown in FIGS. 9A to 13B.

Note that in the present embodiment, it is preferable to set the transmittance of the channel protection film 5 for the laser beam to: below 37% before laser irradiation; and 37% or more after laser irradiation. In other words, in this processing, the channel protection film 5 is formed using a condition, a material, and so on such that the transmittance for the laser beam is 37% or more.

Thus, by setting the transmittance after irradiation of the laser beam to 37% or more, it is possible to readily transmit, through the channel protection film 5, the laser beam for crystallizing the noncrystalline semiconductor thin film 4a. This allows readily crystallizing the noncrystalline semiconductor thin film 4a located under the channel protection film 5, thus efficiently conducting, to the channel protection film 5 located immediately above, the heat generated when the noncrystalline semiconductor thin film 4a becomes crystallized. Accordingly, in the subsequent process, it is possible to promote mineralization of the channel protection film 5.

Next, as shown in (h) in FIG. 20, the noncrystalline semiconductor thin film 4a is crystallized by annealing the noncrystalline semiconductor thin film 4a. With this, as shown in the figure, it is possible to form the channel layer 4 including the channel region, on the gate insulating film 3.

In the present embodiment, as shown in the figure, the noncrystalline semiconductor thin film 4a is crystallized by irradiating the noncrystalline semiconductor thin film 4a with the laser beam from above the channel protection film 5. At this time, since the channel protection film 5 is already transparentized, the noncrystalline semiconductor thin film 4a under the channel protection film 5 is irradiated with the laser beam transmitted through the channel protection film 5. Accordingly, it is possible to crystallize the noncrystalline semiconductor thin film 4a under the channel protection film 5.

Note that it is possible to use, as the laser source for the laser beam, the source that emits light having a wavelength of an ultraviolet region, a visible light region, or an infrared region, and it is possible to selectively use these light sources according to each one of: the process of transparentizing the organic film as shown in (g) in FIG. 20 and the process of crystallizing the semiconductor thin film shown in (h) in FIG. 20.

According to the present embodiment, it is possible to use the laser that emits a wavelength of the ultraviolet region. Preferably, it is possible to use an excimer laser having an emission wavelength that ranges from approximately 190 nm to 350 nm, in which the absorption coefficient of the organic film rapidly changes from the opaque region to the transparent region.

At this time, the channel protection film 5 is further mineralized due to the heat conducted from the noncrystalline semiconductor thin film 4a to the channel protection film 5. For example, when the temperature of the laser for irradiating the organic film 5a is higher than the temperature of the laser for irradiating the noncrystalline semiconductor thin film 4a, the channel protection film 5 is further mineralized.

Note that for crystallizing the noncrystalline semiconductor thin film 4a, not only the laser annealing method but also rapid thermal processing (RTP) may be used.

Next, as shown in (i) to (k) in FIG. 20, the same processing as (h) to (j) in FIG. 2 is performed. This allows obtaining the thin-film semiconductor device having the same configuration as that of the first embodiment.

As described above, according to the method of manufacturing the thin-film semiconductor device according to the present embodiment, as with the first embodiment, irradiating the organic film 5a with a desired laser beam increases the transmittance of the organic film 5a to transparentize the organic film 5a, and also increases the temperature of the organic film 5a to mineralize the organic film 5a.

Thus, by mineralizing the channel protection film 5, the fixed charge of the channel protection film 5 can be reduced, thus suppressing the generation of the back channel. This allows realizing the thin-film semiconductor device having an advantage in OFF characteristics.

In addition, since the trap levels in the channel protection film 5 can be reduced by mineralizing the channel protection film 5, it is possible to suppress the trapping of carriers in the channel protection film 5. Thus, since this suppresses shifting of the threshold voltage in the thin-film semiconductor device, it is possible to realize a thin-film semiconductor device that is highly reliable and has high in-plane uniformity.

Furthermore, in the present embodiment, since the process of increasing the transmittance of the organic film 5a (channel protection film 5) and the process of crystallizing the noncrystalline semiconductor thin film 4a are performed separately, laser irradiation can be performed under the condition desired for each of the processes. Accordingly, this allows reliably increasing the transmittance of the organic film 5a as well as reliably crystallizing the noncrystalline semiconductor thin film 4a.

Embodiment 3

Figure 21:
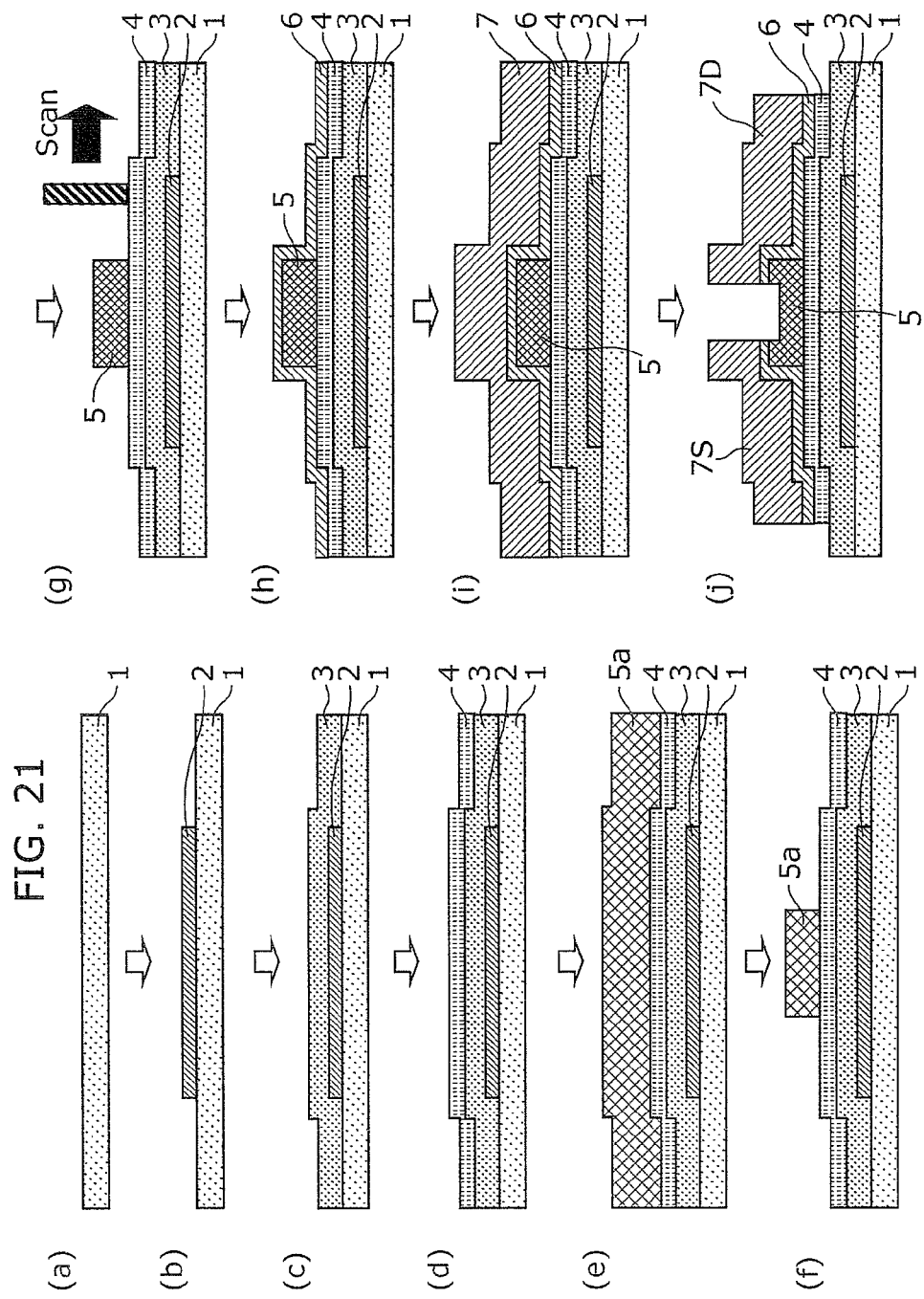
FIG. 21 is a cross-sectional view for describing a method of manufacturing a thin-film semiconductor device according to a third embodiment of the present disclosure.

Next, the method of manufacturing a thin-film semiconductor device according to a third embodiment of the present disclosure will be described with reference to FIG. 21. FIG. 21 is a cross-sectional diagram for describing the method of manufacturing the thin-film semiconductor device according to the third embodiment of the present disclosure. Note that in FIG. 21, the same constituent element as the constituent element shown in FIG. 2 is assigned with the same numerical reference.

The thin-film semiconductor device manufactured by the manufacturing method according to the present embodiment has the same configuration as that of the thin-film semiconductor device 10 according to the first embodiment. In other words, the present embodiment is different from the first embodiment in the manufacturing method.

Specifically, according to the manufacturing method in the first embodiment, as shown in (f) in FIG. 2, transparentizing the organic film 5a and mineralizing the noncrystalline semiconductor thin film 4a are performed at the same time by irradiating the organic film 5a with a laser beam; however, in the present embodiment, as with the second embodiment, the process of transparentizing and mineralizing the organic film 5a and the process of crystallizing the noncrystalline semiconductor thin film 4a are performed separately. In addition, in the present embodiment, as with the second embodiment, the process of crystallizing the noncrystalline semiconductor thin film 4a is performed in advance of the process of transparentizing and mineralizing the organic film 5a.

Hereinafter, a specific method of manufacturing the thin film semiconductor device according to the present embodiment will be described with reference to FIG. 21.

First, as shown in (a) to (c) in FIG. 21, the same processing as (a) to (c) in FIG. 2 is performed. This allows forming, above the substrate 1, the gate electrode 2 and the gate insulating film 3 having a predetermined shape.

Next, as shown in (d) in FIG. 21, the channel layer 4 is formed on the gate insulating film 3, using a crystalline silicon thin film. The channel layer 4 can be formed, as described above, by forming an amorphous silicon film and annealing, so as to crystallize, the amorphous silicon film with a laser and so on. Alternatively, by the method such as direct growth by CVD, it is also possible to form the crystalline silicon thin film.

Next, as shown in (e) in FIG. 21, the same processing as (e) in FIG. 2 is performed. In other words, on the channel layer 4, as a precursor of the channel protection film 5, the organic film 5a is formed by a predetermined application method, using an organic material. In addition, it is preferable to form the organic film 5a such that the transmittance for the laser beam for the next irradiation is below 37%. Note that prebaking is performed on the organic film 5a.

Next, as shown in (f) in FIG. 21, the same processing as (f) in FIG. 2 is performed. In other words, by exposure and development using a photomask, the organic film 5a is patterned into a predetermined shape.

Next as shown in (g) in FIG. 21, the organic film 5a is irradiated with a laser beam by scanning, by the laser annealing method, the substrate 1 with a predetermined laser beam relatively in a predetermined direction. This increases the transmittance of the organic film 5a irradiated with the laser beam, so that the organic film 5a is transparentized. In this case, it is preferable to perform the scanning such that the transmittance of the organic film 5a after laser irradiation is 37% or more. Furthermore, the organic film 5a is mineralized when irradiated with the laser beam.

Note that the type of the organic material of the organic film 5a, the wavelength of the laser beam, and the condition for laser irradiation (heating temperature) can be determined, as with the first embodiment, using FIGS. 14 and 11A to 13B.

Next, as shown in (h) to (j) in FIG. 20, the same processing as (h) to (j) in FIG. 2 is performed. This allows obtaining the thin-film semiconductor device having the same configuration as that of the first embodiment.

As described above, according to the method of manufacturing the thin-film semiconductor device according to the present embodiment, as with the first embodiment, it is possible to transparentize the organic film 5a by increasing the transmittance of the organic film 5a by irradiating the organic film 5a with a desired laser beam, along with mineralizing the organic film 5a by increasing the temperature of the organic film 5a.

Thus, mineralizing the channel protection film 5 allows reducing the fixed charge of the channel protection film 5, so that it is possible to suppress the generation of the back channel. This allows realizing the thin-film semiconductor device having an advantage in OFF characteristics.

In addition, since it is possible to reduce the trap levels in the channel protection film 5 by mineralizing the channel protection film 5, it is possible to suppress the trapping of carriers in the channel protection film 5. Since this suppresses the shift in the threshold voltage in the thin-film semiconductor device, it is possible to realize a thin-film semiconductor device that is highly reliable and has high in-plane uniformity.

Furthermore, in the present embodiment, since the process of increasing the transmittance of the organic film 5a (channel protection film 5) and the process of crystallizing the noncrystalline semiconductor thin film 4a are preformed separately, it is possible to perform laser irradiation under the condition desired for each of the processes. Accordingly, this allows reliably increasing the transmittance of the organic film 5a as well as reliably crystallizing the noncrystalline semiconductor thin film 4a.

Embodiment 4

Next, a fourth embodiment of the present disclosure will be described. The present embodiment is an example of application to a display apparatus of the thin-film semiconductor device according to each of the embodiments described above, and in the present embodiment, an example of application to the organic EL display apparatus is described.

Figure 22:
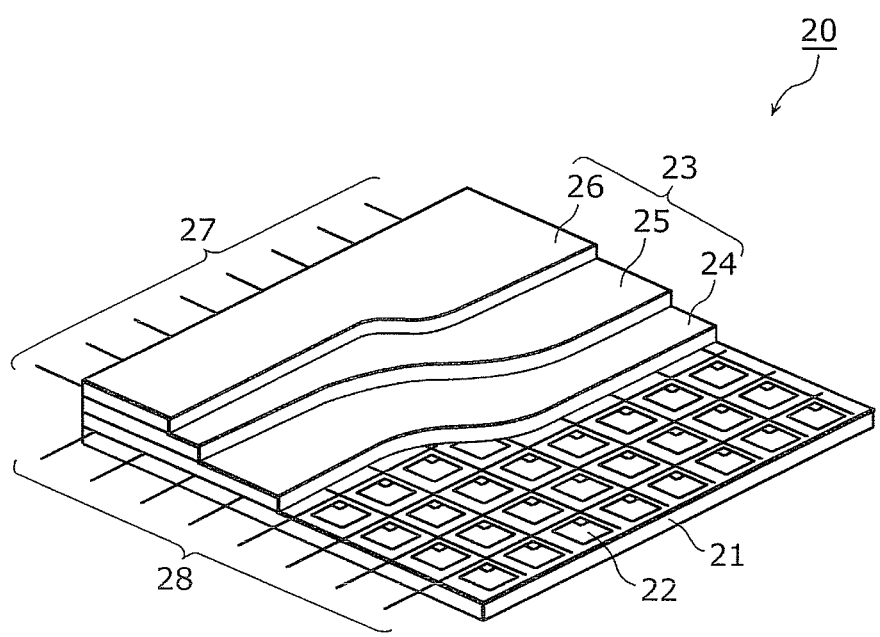
FIG. 22 is a partially cutaway perspective view of an organic electroluminescence (EL) display apparatus according to a fourth embodiment of the present disclosure.

FIG. 22 is a partially cutaway perspective view of an organic EL display apparatus according to the fourth embodiment of the present disclosure. The thin-film semiconductor device as described above can be used as a switching transistor or a driving transistor for an active matrix substrate in the organic EL display apparatus.

As shown in FIG. 22, the organic EL display apparatus 20 includes: an active matrix substrate (TFT array substrate) 21; a plurality of pixels 22 arranged in a matrix on the active matrix substrate 21; an organic EL device 23 formed corresponding to each of the pixels 22; a plurality of scan lines (gate lines) 27 formed along a row direction of the pixels 22; a plurality of video signal lines (source lines) 28 formed along a column direction of the pixels 22; and power lines 29 (not shown) formed in parallel with the video signal lines 28. The organic EL device 23 includes an anode 24, an organic EL layer 25, and a cathode 26 that are stacked in order on the active matrix substrate 21. Note that in practice a plurality of anodes 24 are formed corresponding to the pixels. In addition, a plurality of organic EL layers 25 are also formed corresponding to the pixels 22, and each organic EL layer 25 includes an electron transport layer, an emission layer, a hole transport layer, and so on that are stacked.

Figure 23:
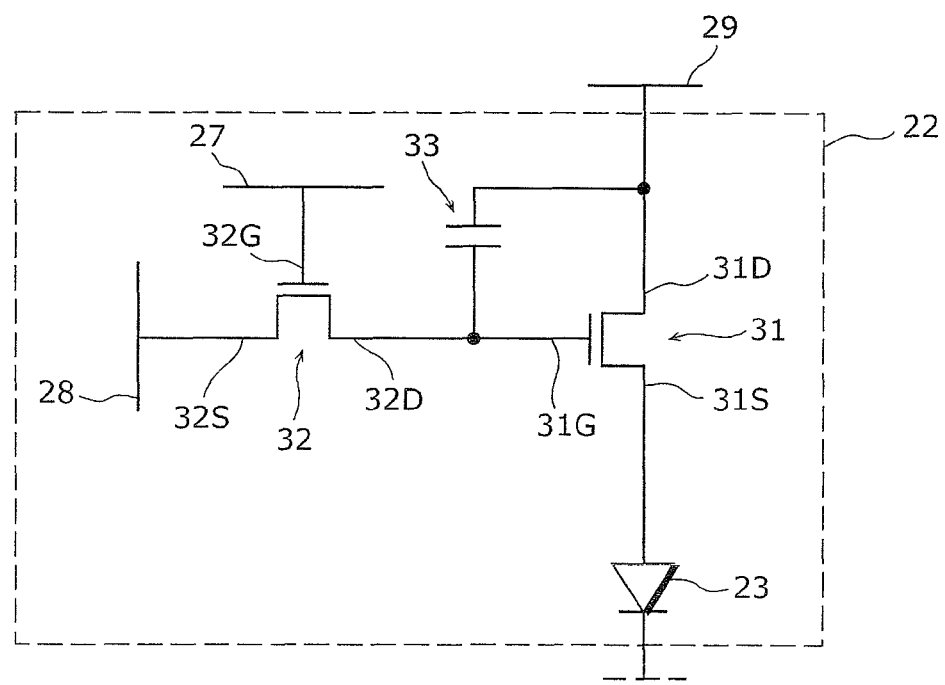
FIG. 23 is a diagram showing a circuit configuration of a pixel in a display apparatus using the thin-film semiconductor device according to the first embodiment of the present disclosure.

Next, the circuit configuration of the pixels 22 in the organic EL display apparatus 20 will be described with reference to FIG. 23. FIG. 23 is a diagram showing the circuit configuration of a pixel using a thin-film semiconductor device according to the first embodiment of the present disclosure.

As shown in FIG. 23, each pixel 22 is partitioned by the scan line 27 and the video signal line 28 that are orthogonal to each other, and includes a driving transistor 31, a switching transistor 32, a condenser 33, and an organic EL device 23. The driving transistor 31 is a transistor that drives the organic EL device 23, and in addition, the switching transistor 32 is a transistor that selects the pixel 22.

In the driving transistor 31, a gate electrode 31G is connected to a drain electrode 32D of the switching transistor 32, a source electrode 31S is connected to the anode of the organic EL device 23 via a relay electrode (not shown), and a drain electrode 31D is connected to the power line 29.

In addition, in the switching transistor 32, the gate electrode 32G is connected to the scan line 27, the source electrode 32S is connected to the video signal line 28, and the drain electrode 32D is connected to the condenser 33 and the gate electrode 31G of the driving transistor 31.

In this configuration, when a gate signal is input into the scan line 27 to turn the switching transistor 32 into an ON state, the video signal voltage supplied via the video signal line 28 is written into the condenser 33. The video signal voltage written into the condenser 33 is held for a period of one frame, and this held video signal voltage causes analogue change in the conductance of the driving transistor 31 and causes the drive current corresponding to luminescence levels to flow from the anode to the cathode of the organic EL device 23, so that the organic EL device 23 produces luminescence.

Note that in the present embodiment, the organic EL display apparatus using the organic EL device has been described, but the thin-film semiconductor device according to the present embodiment is also applicable to another display device in which the active matrix substrate is used. In addition, the display apparatus thus configured can be used as a flat panel display, and is applicable to an electronic apparatus including a display panel of various types such as a television set, a personal computer, and a cellular phone.

As described above, the thin-film semiconductor device according to the present embodiment and the method of manufacturing thereof have been described, but the present disclosure in not limited to the embodiment described above.

For example, in the embodiment described above, a silicon thin film is used as a semiconductor thin film, but it is possible to use a semiconductor film other than the silicon thin film. For example, it is possible to form a channel layer using a crystalline semiconductor thin film by crystallizing the semiconductor thin film made of germanium (Ge) or SiGe.

In addition, in the embodiment described above, the crystalline silicon thin film may be an n-type semiconductor or a p-type semiconductor.

Note that other than this, those skilled in the art will readily appreciate that many modifications are possible in the exemplary embodiments without materially departing from the novel teachings and advantages of the present disclosure. Accordingly, all such modifications are intended to be included within the scope of the present disclosure.

INDUSTRIAL APPLICABILITY

A thin-film semiconductor device according to an implementation of the present disclosure is widely applicable to a display apparatus in a television set, a personal computer, a cellular phone, and so on, or a various types of other electronic devices including a thin-film transistor.

The invention claimed is:

1. A method of manufacturing a thin-film semiconductor device, comprising:
   preparing a substrate;
   forming a gate electrode above the substrate;
   forming a first insulating film on the gate electrode;
   forming a semiconductor thin film that is to be a channel layer, on the first insulating film;
   forming a second insulating film, that is formed of an organic material film, on the semiconductor thin film;
   irradiating the second insulating film with a beam to increase a transmittance of the second insulating film; and
   forming a source electrode and a drain electrode above the channel layer,
   wherein in the irradiating, the second insulating film is mineralized by irradiation of the beam.

2. The method of manufacturing a thin-film semiconductor device according to claim 1,
   wherein in the forming of a second insulating film, the second insulating film is formed using an organic material having a transmittance of below 37 percent for the beam, and
   in the irradiating, the transmittance of the second insulating film is increased to 37 percent or more through irradiation of the beam.

3. The method of manufacturing a thin-film semiconductor device according to claim 1,
   wherein in the forming of a semiconductor thin film, the semiconductor thin film formed is noncrystalline, and
   in the irradiating, the second insulating film is irradiated with the beam from above to crystallize the semiconductor thin film under the second insulating film.

4. The method of manufacturing a thin-film semiconductor device according to claim 1,
   wherein in the forming of a semiconductor thin film, the semiconductor thin film formed is noncrystalline, and
   the method further comprises crystallizing the semiconductor thin film between the irradiating and the forming of a source electrode and a drain electrode.

5. The method of manufacturing a thin-film semiconductor device according to claim 1, wherein in the forming of a semiconductor thin film, the semiconductor thin film formed is crystallized.

6. The method of manufacturing a thin-film semiconductor device according to claim 1, wherein before irradiation of the beam, a product of an absorption coefficient of the second insulating film and a film thickness of the second insulating film is greater than 1.

7. The method of manufacturing a thin-film semiconductor device according to claim 1, wherein after irradiation of the beam, a product of an absorption coefficient of the second insulating film and a film thickness of the second insulating film is 1 or less.

8. The method of manufacturing a thin-film semiconductor device according to claim 1, wherein the second insulating film is mineralized when the beam causes photoreaction or thermal reaction to progress in the second insulating film.

9. The method of manufacturing a thin-film semiconductor device according to claim 1, wherein a wavelength of a beam ranges from 190 nm to 350 nm.

10. The method of manufacturing a thin-film semiconductor device according to claim 1, wherein the second insulating film is transparentized, and is irradiated at the same time as the semiconductor thin film.

11. The method of manufacturing a thin-film semiconductor device according to claim 1, wherein at least a part of the source electrode and the drain electrode is above the second insulating film.

12. The method of manufacturing a thin-film semiconductor device according to claim 1, wherein the second insulating film is opaque and transparentized by the beam irradiation.

* * * * *